(12) United States Patent
Lee

(10) Patent No.: US 12,719,381 B2
(45) Date of Patent: Aug. 25, 2026

(54) ELEMENT MODULE AND PV INVERTER MODULE COMPRISING SAME

(71) Applicant: LG INNOTEK CO., LTD., Seoul (KR)

(72) Inventor: Un Hak Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 333 days.

(21) Appl. No.: 18/690,501

(22) PCT Filed: Sep. 7, 2022

(86) PCT No.: PCT/KR2022/013471

§ 371 (c)(1),
(2) Date: Mar. 8, 2024

(87) PCT Pub. No.: WO2023/038441

PCT Pub. Date: Mar. 16, 2023

(65) Prior Publication Data

US 2024/0380333 A1 Nov. 14, 2024

(30) Foreign Application Priority Data

Sep. 8, 2021 (KR) ........................ 10-2021-0120053

(51) Int. Cl.
*H02M 7/00* (2006.01)
*H05K 7/20* (2006.01)
*H02S 40/32* (2014.01)

(52) U.S. Cl.
CPC ............ *H02M 7/003* (2013.01); *H05K 7/209* (2013.01); *H02S 40/32* (2014.12)

(58) Field of Classification Search
CPC ........................................................ H01L 23/40
See application file for complete search history.

(56) References Cited

U.S. PATENT DOCUMENTS 10,779,445 B2 * 9/2020 Chung .................... B60L 50/51

FOREIGN PATENT DOCUMENTS

CN 110417280 B * 8/2021 .............. F04B 35/04
JP 2010-87002 A 4/2010
(Continued)

OTHER PUBLICATIONS

KR 2020-0056128 A English translation (Year: 2020).*
JP 2010087002 A English translation (Year: 2010).*
CN 110417280 B English translation (Year: 2019).*

*Primary Examiner* — Mukundbhai G Patel
(74) *Attorney, Agent, or Firm* — Birch, Stewart, Kolasch & Birch, LLP

(57) ABSTRACT

An element module, according to one embodiment of the present invention, comprises one or more first elements, and an element holder for accommodating the first elements, wherein the first element includes a body, and one or more connecting pins being extended from the body, the element holder includes a base, and an element accommodation part formed at the base so as to accommodate the one or more first elements, the element accommodation part includes a first region in which the body of the first element is disposed and which is open toward a first surface of the base, and a second region in which the connecting pins of the first element are disposed and which is open toward a second surface of the base, opposite to the first surface of the base, and the first region and the second region at least partially overlap.

20 Claims, 19 Drawing Sheets

(56) References Cited

FOREIGN PATENT DOCUMENTS

| | | | | | |
|---|---|---|---|---|---|
| JP | 2010087002 | A | * | 4/2010 | |
| JP | 2014-110286 | A | | 6/2014 | |
| KR | 10-2020-0056128 | A | | 5/2020 | |
| KR | 20200056128 | A | * | 5/2020 | ......... H05K 7/20272 |
| KR | 10-2020-0124577 | A | | 11/2020 | |

* cited by examiner (A)

(B)

ELEMENT MODULE AND PV INVERTER MODULE COMPRISING SAME

CROSS REFERENCE TO RELATED APPLICATIONS

This application is the National Phase of PCT International Application No. PCT/KR2022/013471, filed on Sep. 7, 2022, which claims priority under 35 U.S.C. 119 (a) to Patent Application No. 10-2021-0120053, filed in the Republic of Korea on Sep. 8, 2021, all of which are hereby expressly incorporated by reference into the present application.

TECHNICAL FIELD

The present invention relates to an element module and a PV inverter module including the same, and more specifically, to an element module, an element holder, and an inverter module that has excellent heat dissipation effect and is easy to assemble.

BACKGROUND ART

Solar power generation is an eco-friendly energy generation method that is becoming widely used, replacing existing chemical or nuclear power generation. As for solar power generation, there are a stand-alone type in which a battery is connected to the converter and a connected type in which the converter is connected to a power grid; in general, stand-alone type power generation is configured with solar cells, storage batteries, power conversion devices, and the like; and the power grid-connected system is configured to be connected to a commercial power source so that power can be exchanged with load grid lines.

The power generated by solar panels cannot be directly used in homes or buildings, so it is converted into usable power through a power conversion device such as an inverter; and when an inverter performs power conversion, it generates a lot of heat, and heat can deteriorate performance, so heat dissipation is important. In addition, since the inverter is installed outside, sealing to prevent foreign substances from entering the interior is also important.

There is a need to develop technology to improve the heat dissipation and sealing of inverters.

DETAILED DESCRIPTION OF THE INVENTION

Technical Subject

The technical problem to be solved by the present invention is to provide an element module, element holder, and inverter module that has excellent heat dissipation effect and is easy to assemble.

Technical Solution

In order to solve the above technical problem, the element module according to an embodiment of the present invention includes: one or more first elements; and an element holder accommodating the first element, wherein the first element includes a body and one or more connecting pins being extended from the body, wherein the element holder includes a base and an element accommodating part being formed in the base to accommodate one or more first elements, wherein the element accommodating part comprises: a first region in which the body of the first element is disposed, and opened toward to a direction of a first surface of the base; and a second region in which a connecting pin of the first element is disposed, and opened toward to a direction of a second surface of the base which is opposite to the direction of the first surface of the base, and the first region and the second region are overlapped at least in part.

In addition, the element holder may include a coupling protrusion being extended from the first surface of the base and including a coupling hole.

In addition, the coupling protrusion may include: two first hooks being disposed on a side surface of the coupling protrusion and formed in opposite directions to each other; and a guide portion being extended from a side surface of the coupling protrusion in one direction of two directions perpendicular to the direction in which the two first hooks are disposed.

In addition, the coupling protrusion is inserted into the first hole being formed in a substrate and coupled to the substrate; the two first hooks are inserted into a first hole of the substrate and hook-coupled to one surface of the substrate; the guide portion may be inserted into a rib being formed in a first hole of the substrate corresponding to the guide portion to guide coupling with the substrate.

In addition, through the coupling hole, the substrate at an upper portion and the heat dissipation pad and heat sink at a lower portion can be integrally screw-coupled together.

In addition, the first region includes: a first lower surface that is more recessed than the first surface of the base; and a coupling protrusion being extended from the first lower surface of the first region toward the first surface of the base, wherein the body of the first element includes a coupling hole corresponding to the coupling protrusion, wherein a cross-sectional region of the coupling protrusion may have a length in a first direction shorter than a length in a second direction perpendicular to the first direction.

In addition, the first direction may be a direction being overlapped with the second region.

In addition, it includes a plurality of side surfaces being extended from a first lower surface of the first region toward a first surface of the base; wherein the first side surface and the second side surface facing each other among the plurality of side surfaces of the first region include hooks being extended in directions facing each other; and the body of the first element may include a coupling groove corresponding to the hook.

In addition, the second region includes: a second lower surface that is more recessed than a second surface of the base; and a plurality of side surfaces being extended from the second lower surface toward the second surface of the base; wherein the connecting pin of the first element includes: a first extension part being extended from the body in a first direction; and a second extension part being extended from the first extension part in a second direction perpendicular to the first direction; and wherein the second extension part may be exposed in a direction toward the second surface of the base of the second region.

In addition, the first extension part includes: a first-first extension part being extended from the body and having a first width; and a first-second extension part being extended from the first-first extension part and connected to the second extension part, wherein more than half of the region of the first-first extension part may be overlapped with the second region.

In addition, the outermost surface of the body in a direction toward the first surface of the base may be protruded more than the element holder.

In addition, the first element may be a switching element.

In order to solve the above technical problem, the element holder according to an embodiment of the present invention comprises: a base; a coupling protrusion being extended from a first surface of the base and including a coupling hole; and an element accommodating part in which one or more first elements are accommodated, wherein the element accommodating part includes: a first region being opened in a direction toward the first surface of the base; and a second region being opened in a direction toward the second surface of the base opposite to the first surface of the base, and wherein the first region and the second region are overlapped at least in part.

In order to solve the above technical problems, the inverter module according to an embodiment of the present invention includes: a substrate; one or more first elements being electrically connected to the substrate; an element holder accommodating the first element; a heat dissipation pad whose one surface is in contact with the first element accommodated in the element holder; and a heat sink being disposed on the other surface of the heat dissipation pad, wherein the first element includes one or more connecting pins being extended from the body, wherein the element holder includes a base; and an element accommodating part formed in the base to accommodate one or more first elements, wherein the element accommodating part includes: a first region where the body of the first element is disposed and opened in a direction toward the first surface of the base, and a second region where the connecting pin of the first element is disposed and opened in a direction toward the second surface of the base opposite a direction toward the first surface of the base, wherein the first region and the second region are overlapped with each other at least in part, and wherein the substrate, the element holder, the heat dissipation pad, and the heat sink may be integrally screw-coupled together.

Advantageous Effects

According to embodiments of the present invention, heat dissipation performance can be increased through the inductor accommodating groove and the heat sink being extended in multiple directions. In addition, when connecting between cases and between housings comprising the case, the ease of coupling can be increased while improving the sealing effect. In addition, since coupling can be performed through fastening points evenly distributed inside and outside without a separate reinforcement frame, it is possible to reduce material costs and simplify the manufacturing process, and workability is also improved by minimizing the number of screws being fastened inside the wire connecting part.

In addition, space for connecting wires can be utilized efficiently and twisting or tangling of wires can be prevented. Furthermore, one holder can press-connect three switching elements to the heat sink and substrate at the same time.

BEST MODE

Hereinafter, preferred embodiments of the present invention will be described in detail with reference to the accompanying drawings.

However, the technical idea of the present invention is not limited to some embodiments to be described, but may be implemented in various forms, and within the scope of the technical idea of the present invention, one or more of the constituent elements may be selectively combined or substituted between embodiments.

In addition, the terms (including technical and scientific terms) used in the embodiments of the present invention, unless explicitly defined and described, can be interpreted as a meaning that can be generally understood by a person skilled in the art, and commonly used terms such as terms defined in the dictionary may be interpreted in consideration of the meaning of the context of the related technology.

In addition, terms used in the present specification are for describing embodiments and are not intended to limit the present invention.

In the present specification, the singular form may include the plural form unless specifically stated in the phrase, and when described as "at least one (or more than one) of A and B and C", it may include one or more of all combinations that can be combined with A, B, and C.

In addition, in describing the components of the embodiment of the present invention, terms such as first, second, A, B, (a), and (b) may be used. These terms are merely intended to distinguish the components from other components, and the terms do not limit the nature, order or sequence of the components.

And, when a component is described as being 'connected', 'coupled' or 'interconnected' to another component, the component is not only directly connected, coupled or interconnected to the other component, but may also include cases of being 'connected', 'coupled', or 'interconnected' due that another component between that other components.

In addition, when described as being formed or disposed in "on (above)" or "below (under)" of each component, "on (above)" or "below (under)" means that it includes not only the case where the two components are directly in contact with, but also the case where one or more other components are formed or disposed between the two components. In addition, when expressed as "on (above)" or "below (under) ", the meaning of not only an upward direction but also a downward direction based on one component may be included.

Figure 1:
FIG. 1 is a perspective view of an inverter module according to an embodiment of the present invention.
Figure 1:
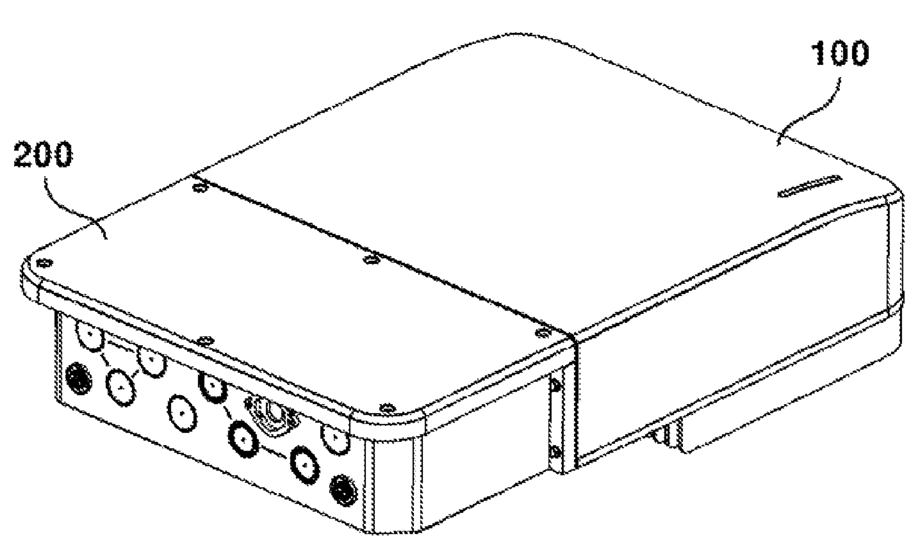

FIG. 1 is a perspective view of an inverter module according to an embodiment of the present invention.

Figure 2:
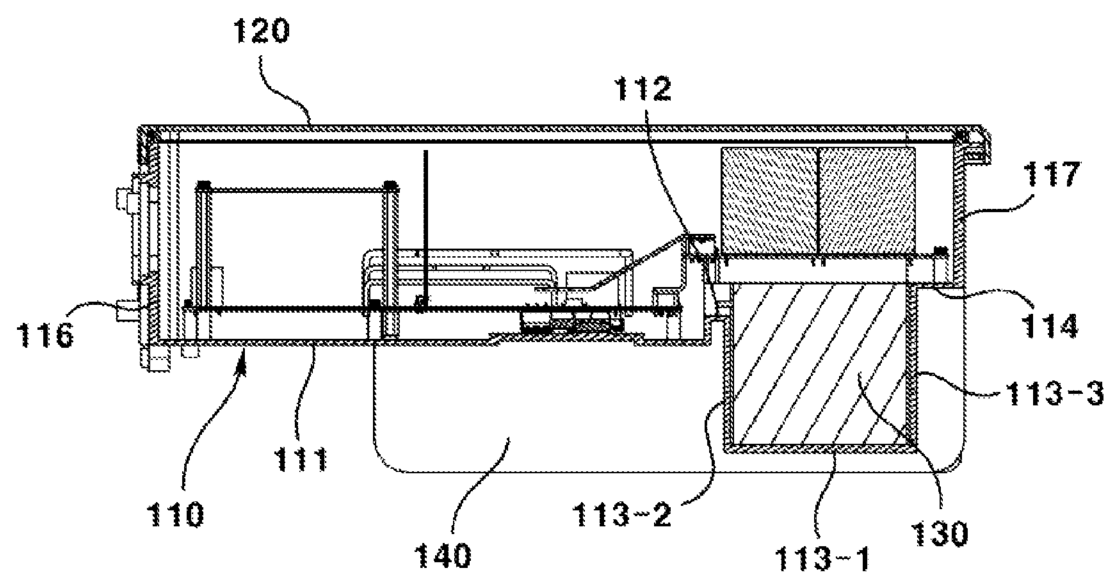
FIG. 2 is a cross-sectional view of an inverter module according to an embodiment of the present invention.
Figure 3:
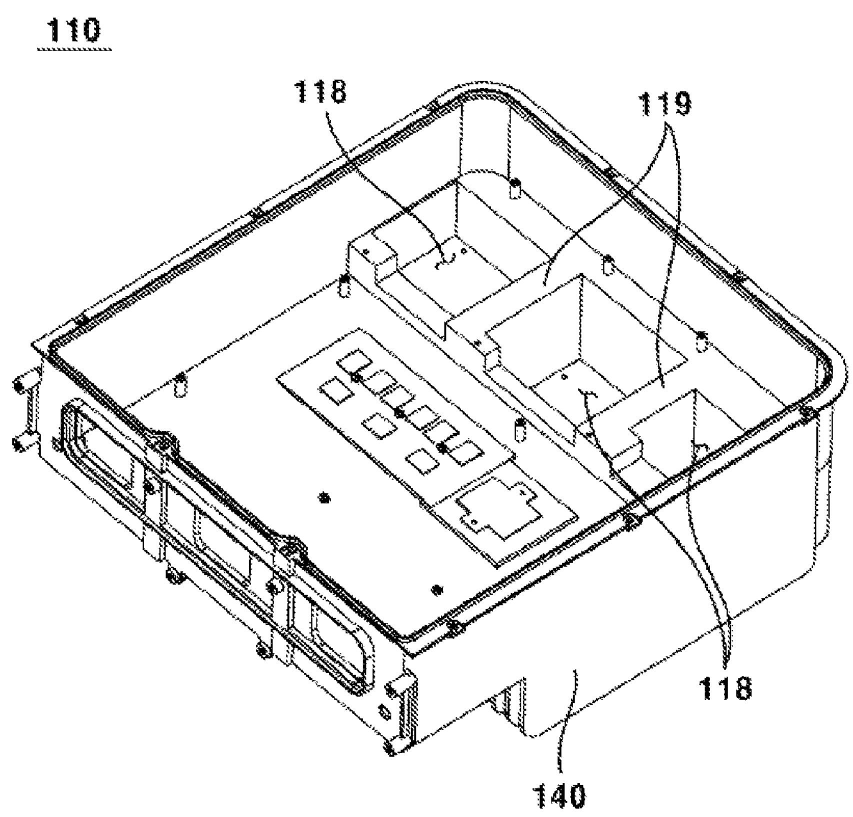
FIG. 3 illustrates the inner surface of an inverter module case according to an embodiment of the present invention.
Figure 4:
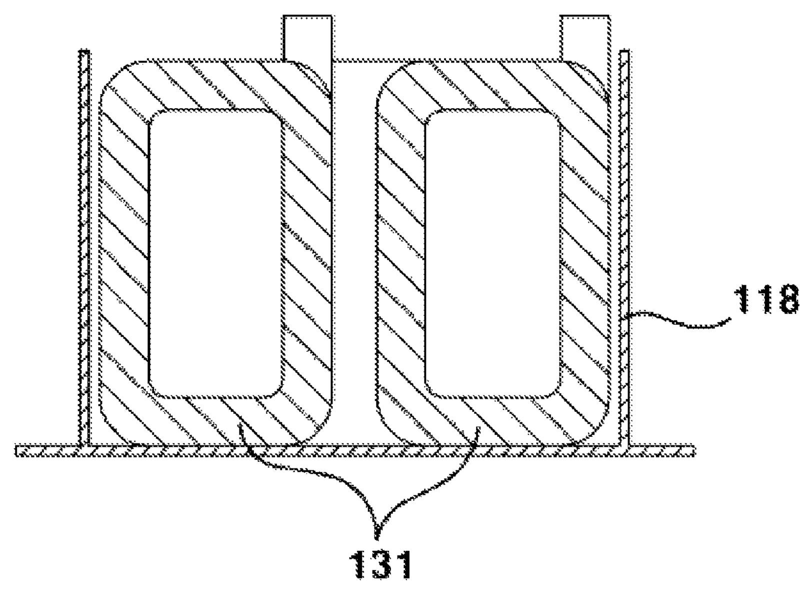
FIG. 4 is a diagram illustrating an inductor according to an embodiment of the present invention being accommodated and molded inside a module case.
Figure 5:
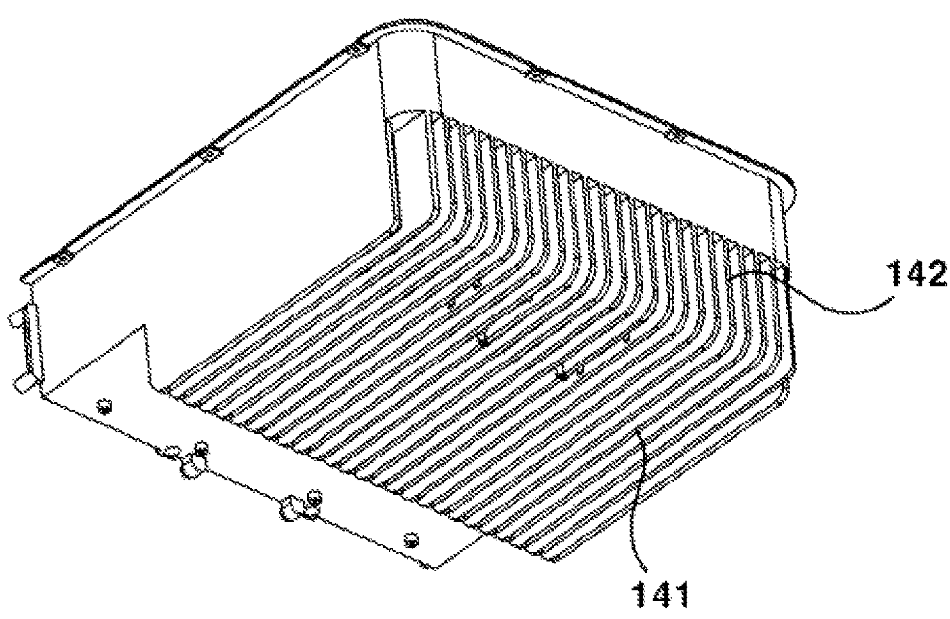
FIG. 5 illustrates a heat sink according to an embodiment of the present invention.
Figure 6:
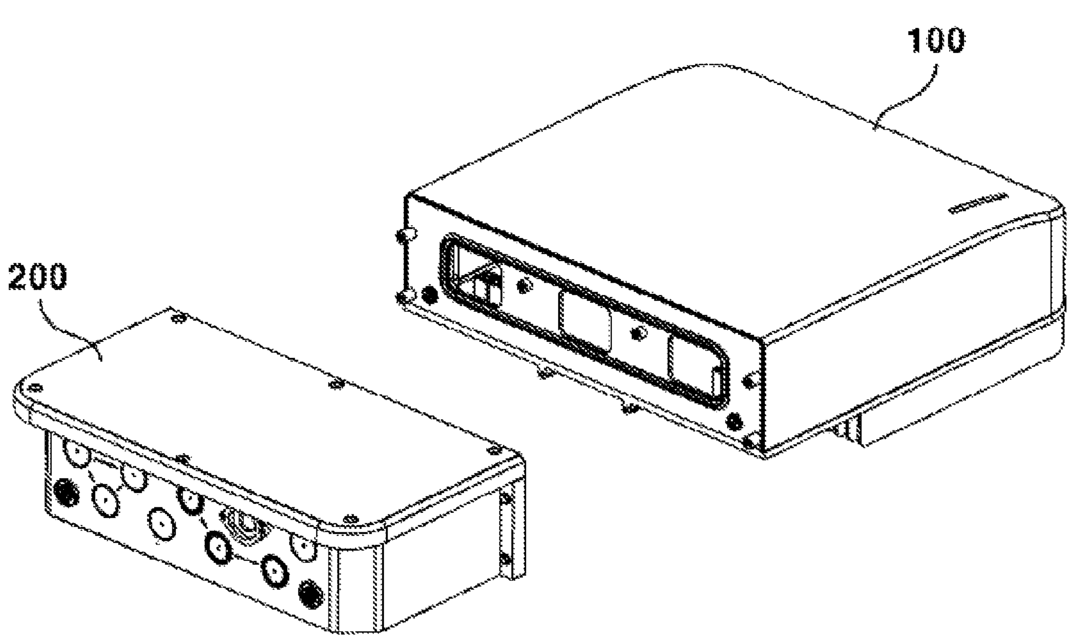
FIG. 6 illustrates the connection relationship between an inductor driving unit and a wire connecting part according to an embodiment of the present invention.
Figure 7:
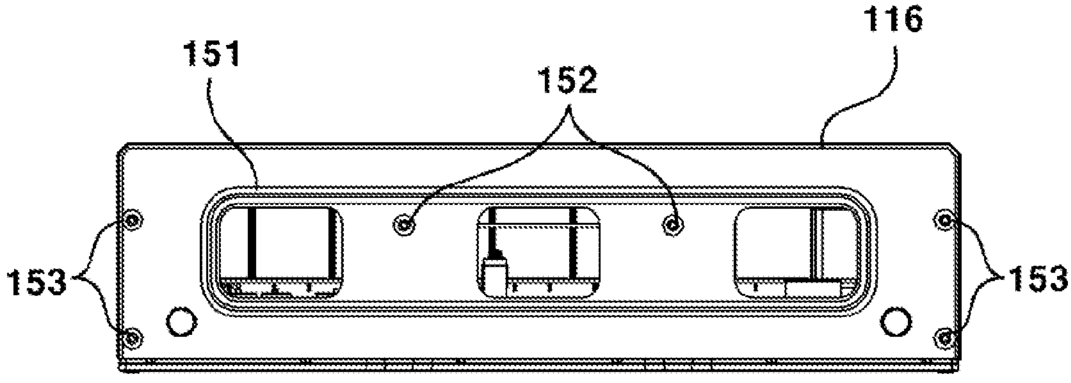
FIGS. 7 to 12 are diagrams for explaining the connection structure of an inductor driving unit and a wire connecting part according to an embodiment of the present invention.
Figure 11:
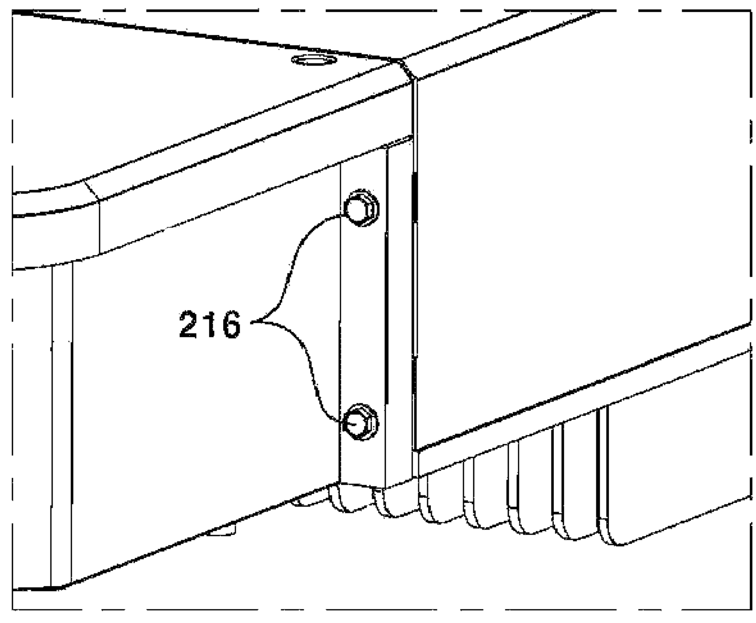
Figure 12:
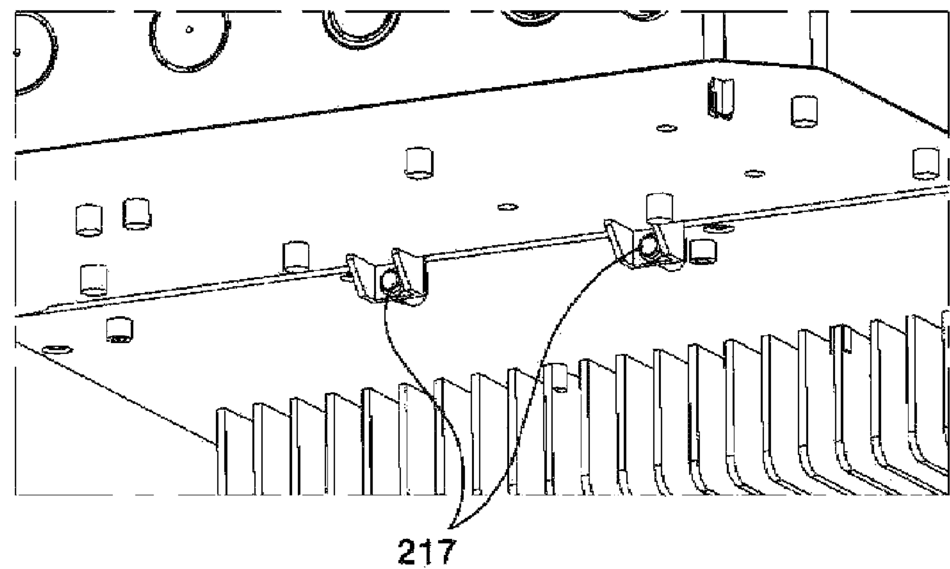
Figure 13:
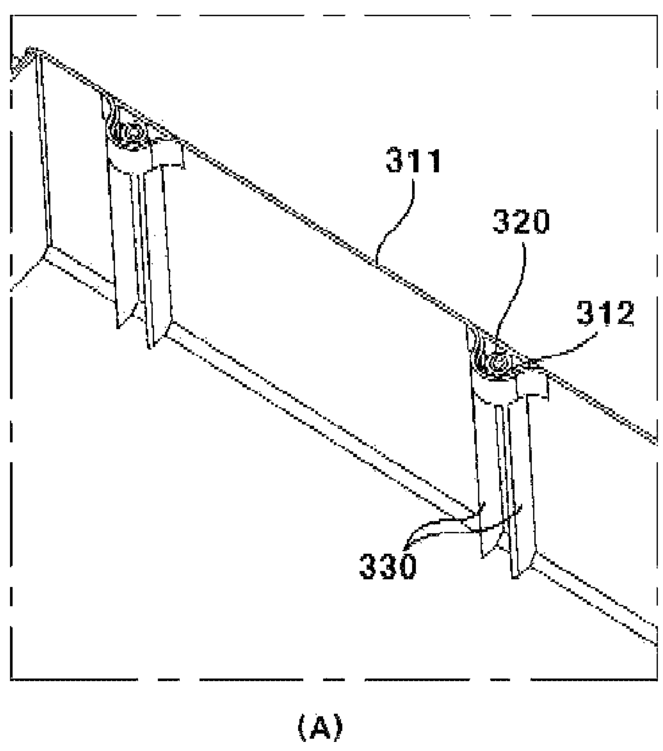
FIGS. 13 to 15 illustrate a sealing structure and a connecting structure according to an embodiment of the present invention.
Figure 13:
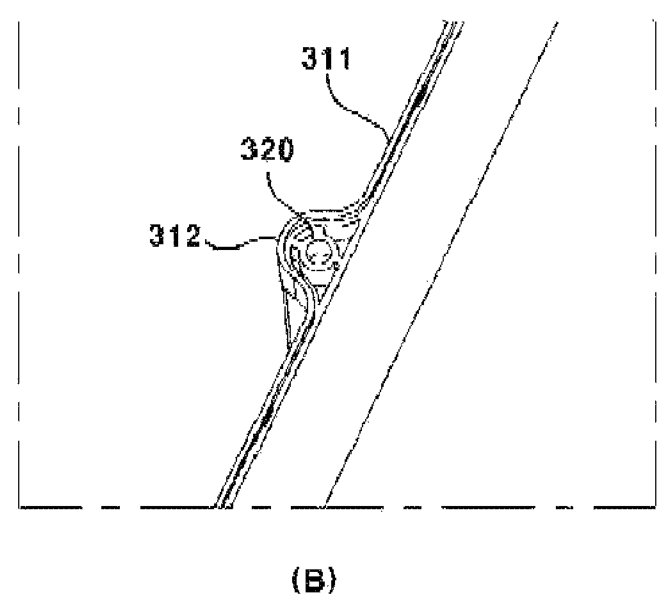
Figure 14:
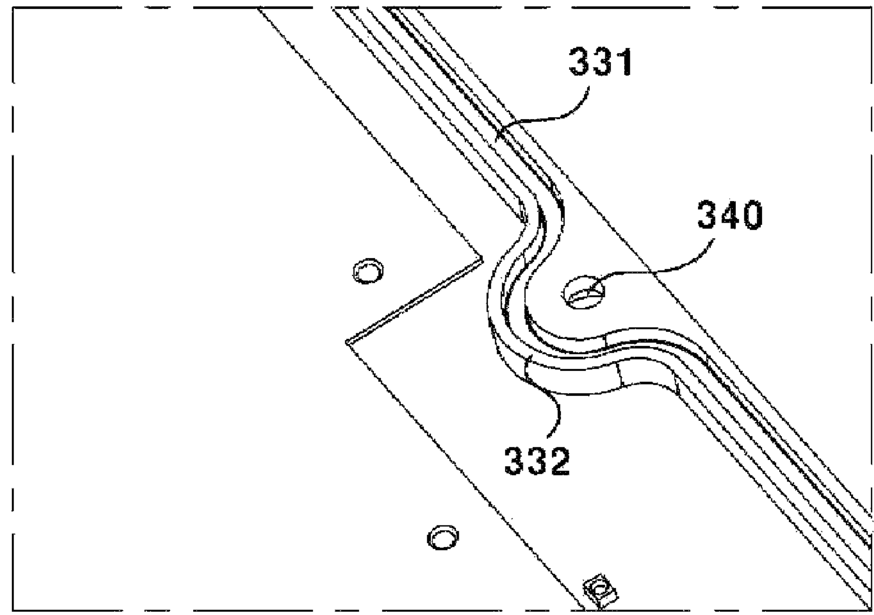
Figure 15:
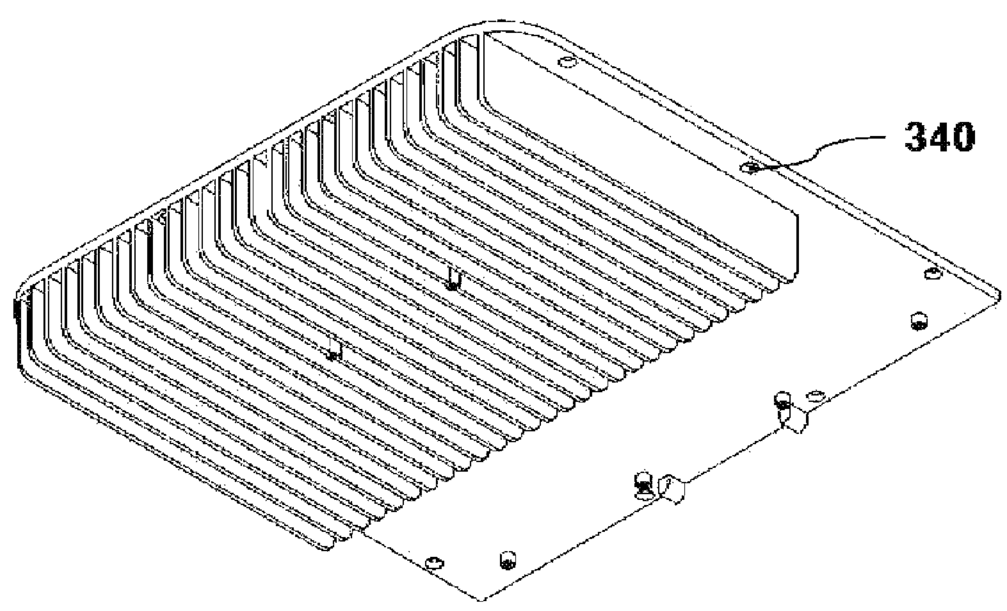
Figure 16:
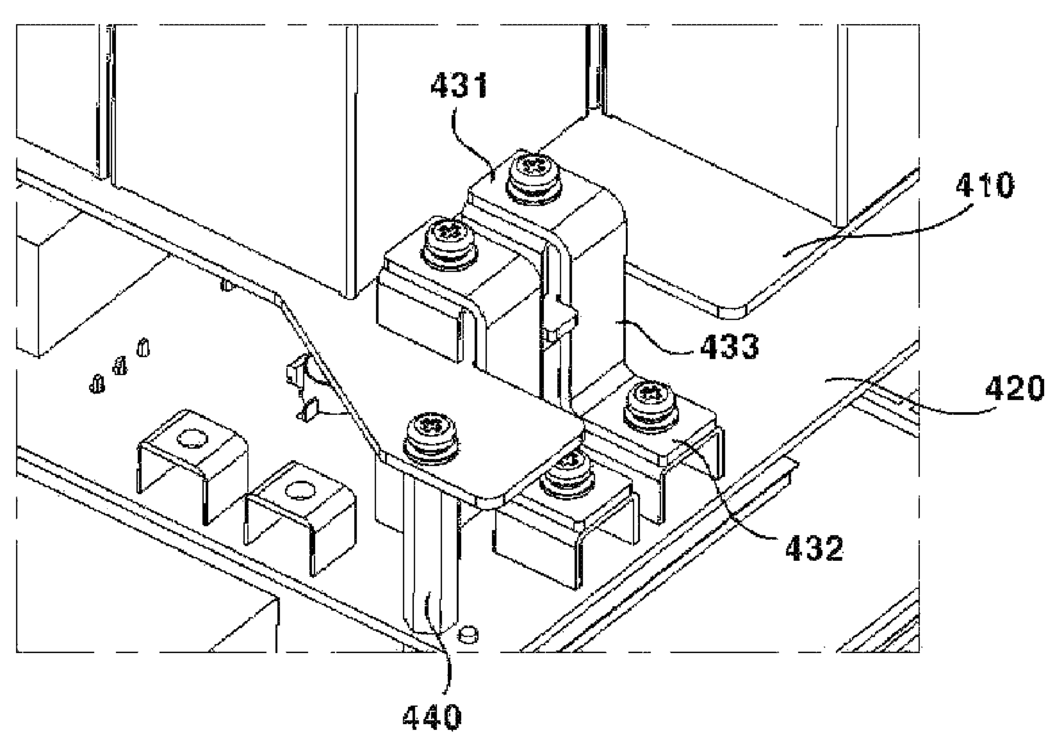
FIGS. 16 to 18 are diagrams for explaining a substrate connection support structure according to an embodiment of the present invention.
Figure 17:
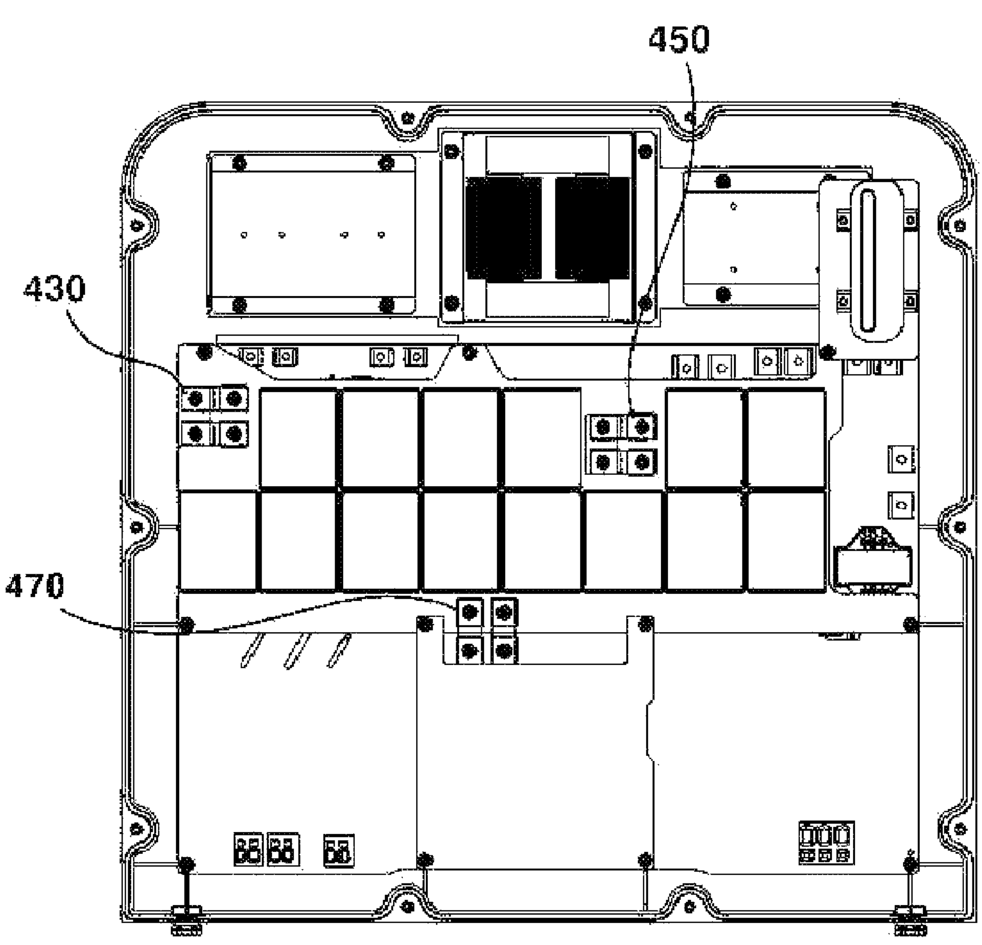
Figure 18:
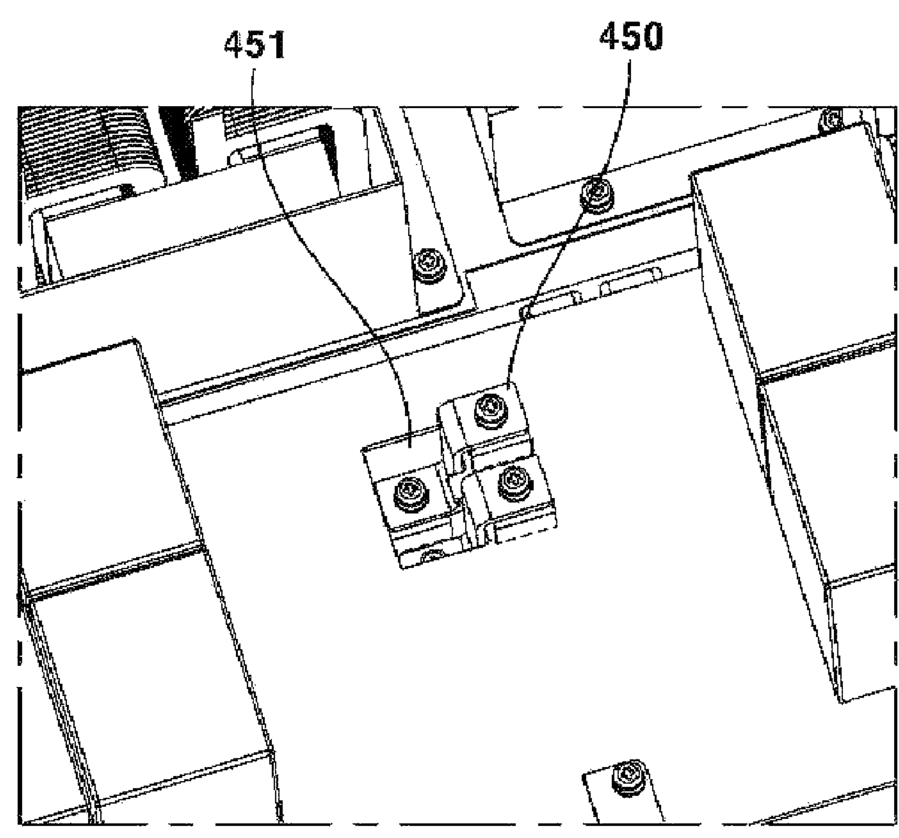
Figure 19:
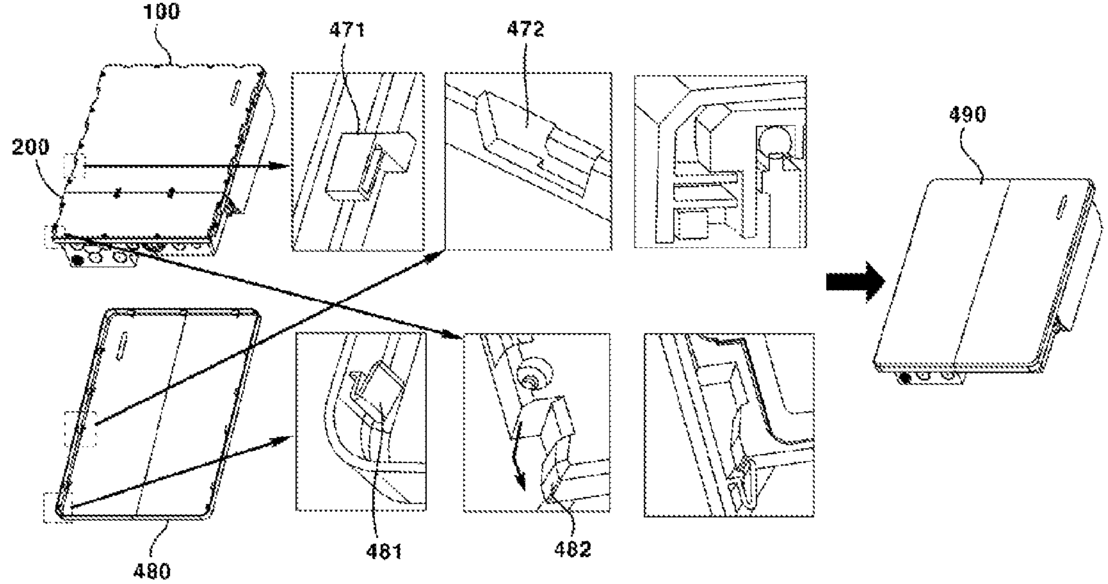
FIG. 19 is a diagram for explaining an external cover according to an embodiment of the present invention.
Figure 20:
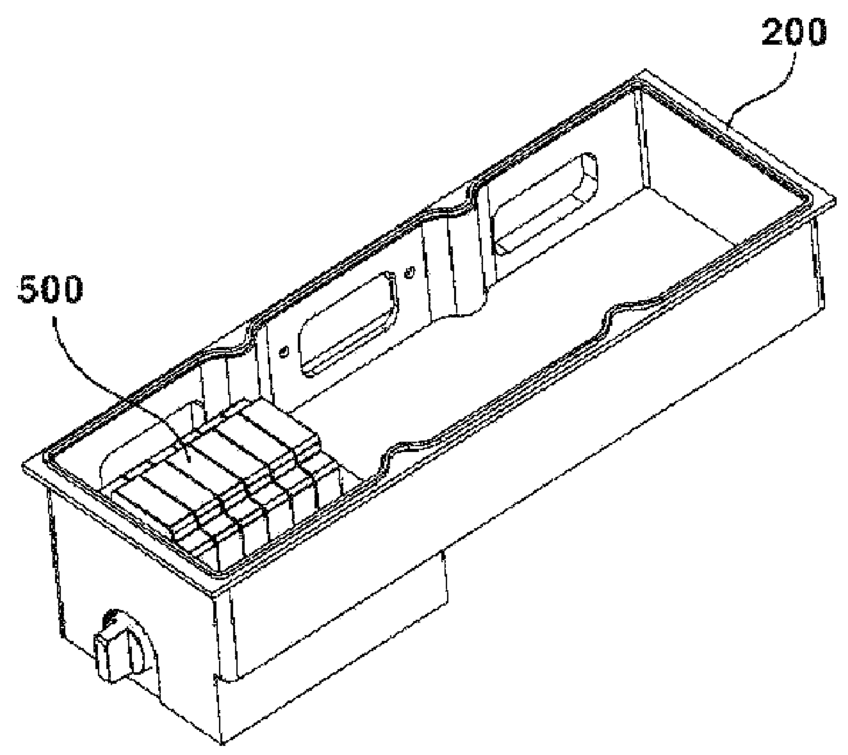
FIGS. 20 to 24 are views for explaining a wiring bracket being formed on a wiring part according to an embodiment of the present invention.
Figure 21:
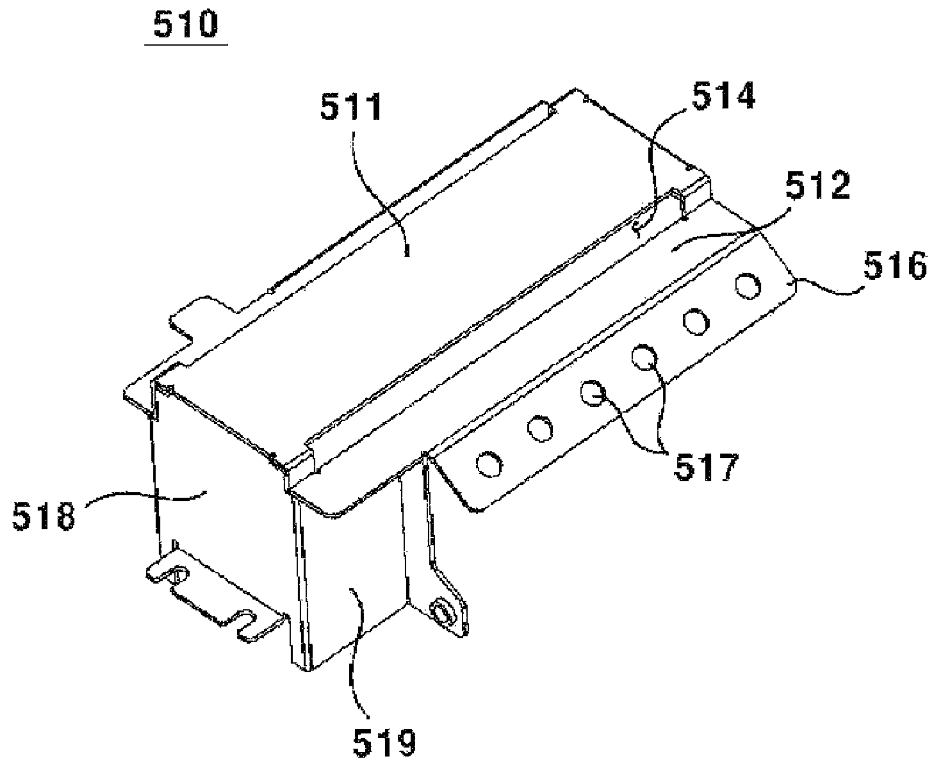
Figure 22:
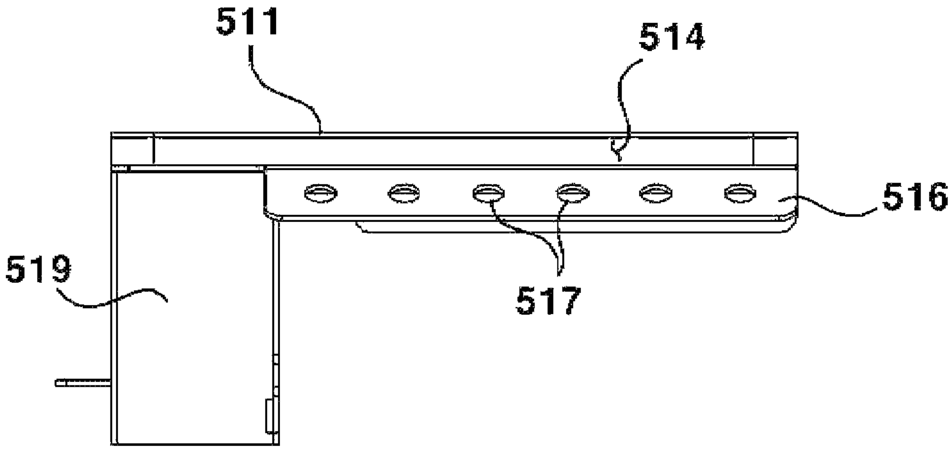
Figure 24:
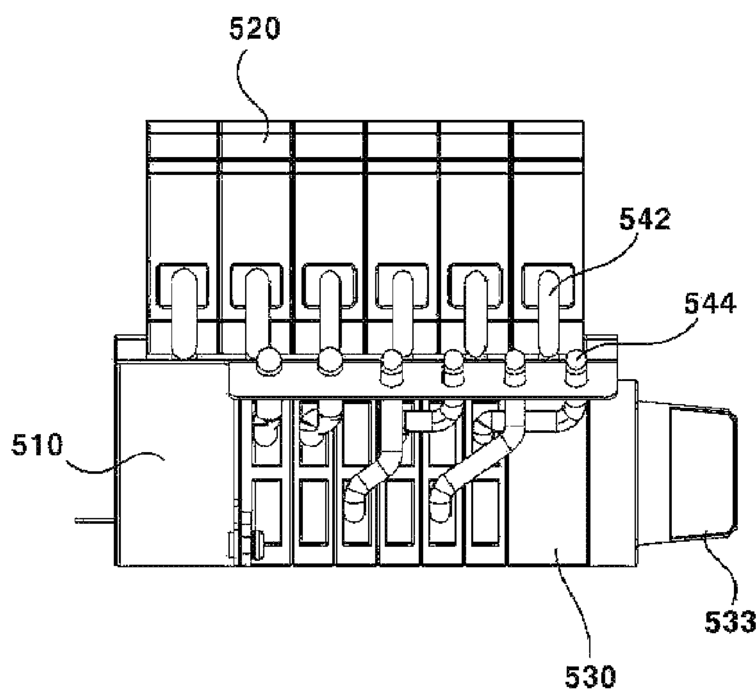
Figure 25:
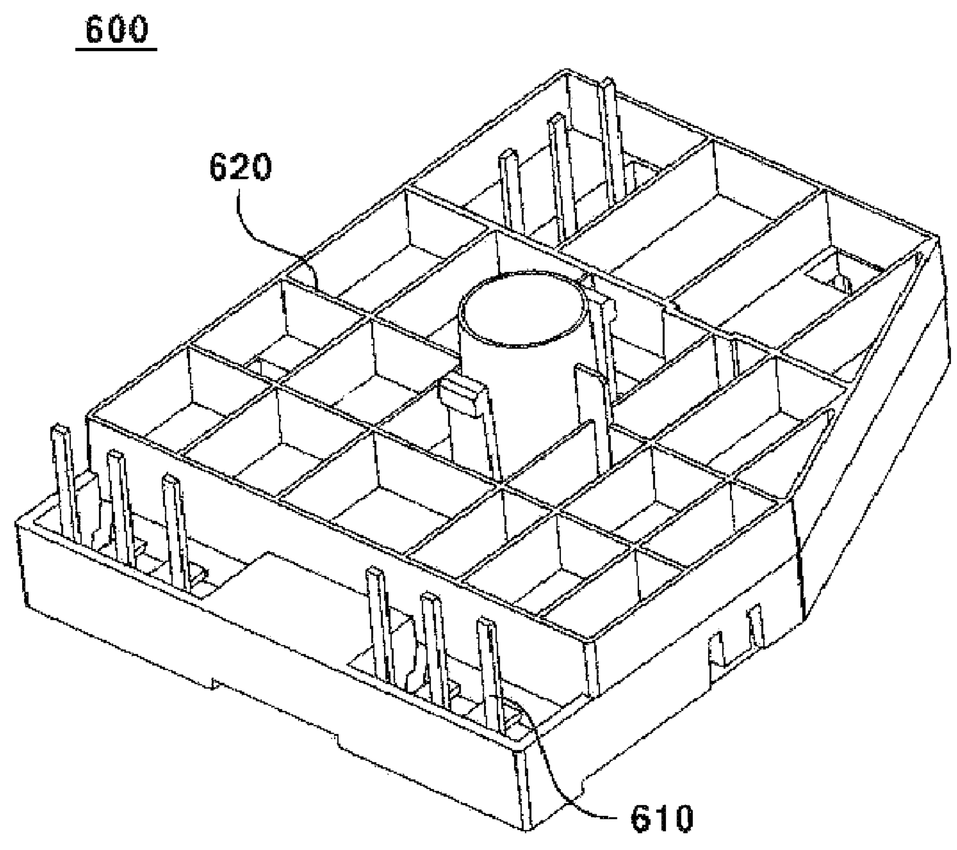
FIG. 25 is a perspective view of an element holder according to an embodiment of the present invention.
Figure 26:
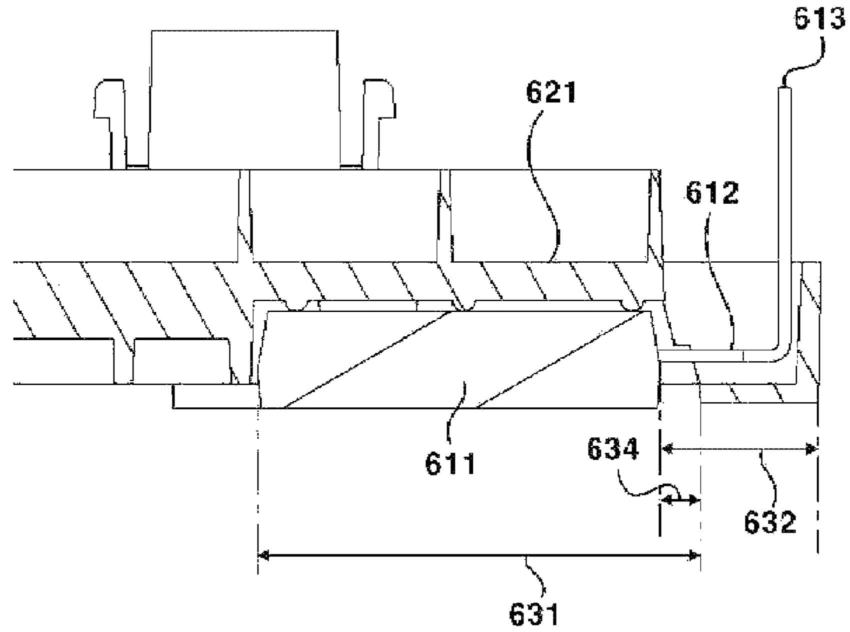
FIGS. 26 to 32 are diagrams for explaining an element and an element holder being accommodated in an element holder according to an embodiment of the present invention.
Figure 27:
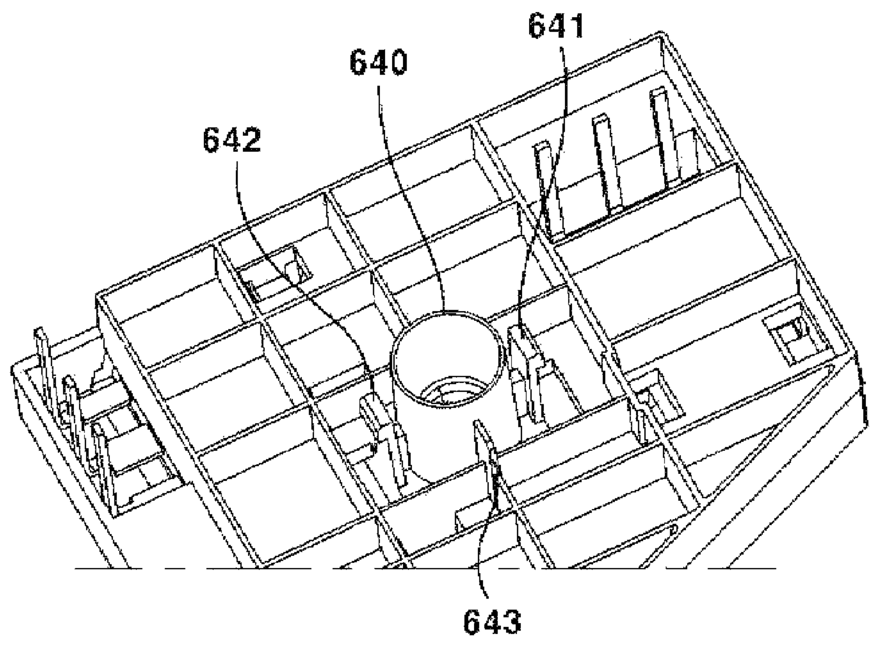

FIG. 2 is a cross-sectional view of an inverter module according to an embodiment of the present invention; FIG. 3 illustrates the inner surface of an inverter module case according to an embodiment of the present invention; FIG. 4 is a diagram illustrating an inductor according to an embodiment of the present invention being accommodated and molded inside a module case; FIG. 5 illustrates a heat sink according to an embodiment of the present invention; FIG. 6 illustrates the connection relationship between an inductor driving unit and a wire connecting part according to an embodiment of the present invention; FIGS. 7 to 12 are diagrams for explaining the connection structure of an inductor driving unit and a wire connecting part according to an embodiment of the present invention; FIGS. 13 to 15 illustrate a sealing structure and a connecting structure according to an embodiment of the present invention; FIGS. 16 to 18 are diagrams for explaining a substrate connection support structure according to an embodiment of the present invention; FIG. 19 is a diagram for explaining an external cover according to an embodiment of the present invention; FIGS. 20 to 24 are views for explaining a wiring bracket being formed on a wiring part according to an embodiment of the present invention. FIG. 25 is a perspective view of an element holder according to an embodiment of the present invention; and FIGS. 26 to 32 are diagrams for explaining an element and an element holder being accommodated in an element holder according to an embodiment of the present invention.

The inverter module 1 according to an embodiment of the present invention is configured with an inverter driving unit 100 and a wire connecting part 200. The inverter module 1 may be a PV inverter module. A PV inverter module is a device that receives power from a PV panel or PV converter and converts it into usable power inside a home or building, and it receives DC power from a PV converter, converts it to AC power, and outputs it. At this time, DC power is transmitted to the inverter driving unit 100 through the wire connecting part 200, the inverter driving unit 100 converts the power, and the converted power is transmitted to the load again through the wire connecting part 200. In order to convert power, the inverter driving unit 100 may include a power conversion element and a switching element or MCU that controls the same. The power conversion element may include a passive element such as an inductor or capacitor, a switching element implemented with a FET or diode, and an MCU that controls the switching element. In addition, various elements for converting power may be included, or elements for implementing functions other than power conversion may be included.

The inverter module 1 according to an embodiment of the present invention is implemented as one module through an inverter module case. The inverter module case is composed of an inverter driving unit 100 and a wire connecting part 200, and each case can be connected to each other to form one inverter module case.

FIG. 2 illustrates a cross-sectional view of an inverter module case according to an embodiment of the present invention, and specifically, it is a case of the inverter driving unit.

The inverter module case according to an embodiment of the present invention includes: a first housing 110 including a base and a plurality of side plates 116 and 117 being extended from the base; and a second housing 120 coupling with the first housing 110.

Here, the first housing can be referred to as a lower housing, a rear housing, a lower case, and a rear case; and the second housing 120 may be referred to as an upper housing, a front housing, an upper case, or a front case that covers the first housing 110. It is natural that they can be opposites depending on a reference or viewing direction.

The first housing 110 includes a base and a plurality of side plates being extended from the base to form an internal space in which the elements comprising the inverter module 1 can be disposed. The second housing 120 may be coupled with the side plates of the first housing 110 to cover the internal space being formed by the first housing 110. Here, the side plate of the first housing 110 is described by dividing it into a plurality of side plates. However, this is for dividing the region of the side plate according to the direction, and the side plate may be an integrated wall structure being extended from the base. Or, they may be formed into structures being distinguished from each other.

In the inner space of the first housing 110, an accommodating groove 130 that accommodates the inductor 131, which is one among the elements included in the inverter module 1 and performs power conversion, is formed. An inductor accommodating groove 130 that accommodates the inductor 131 is formed on one surface of the base. The inductor 131 is an element formed of a coil, and the inductor being included in the inverter module 1 is relatively large in size compared to other elements, and generates more heat than other elements when performing power conversion. The inductor 131 may be disposed and accommodated in the inductor accommodating groove 130 and molded. The inductor 131 generates a lot of heat, and the heat being generated from the inductor 131 can affect not only the inductor itself, but also other elements being affected by heat. As a result, the power conversion function may be deteriorated or malfunction and the like may occur. Therefore, it is necessary to dissipate heat by discharging heat from the inductor 131 to the outside. For heat dissipation, after placing the inductor 131 in the inductor accommodating groove 130, in order to increase thermal conductivity, molding is performed after placing the inductor 131 in the inductor accommodating groove 130. Molding is the process of filling and solidifying a liquid material into a mold of a certain shape, in which the inductor 131 is disposed in an inductor accommodating groove 130 corresponding to the frame, and after connecting to other elements and the like, it can be filled with a material with high thermal conductivity and solidified for heat dissipation. The heat being generated from the inductor 131 is transferred to the first housing 110 along the molded material to be discharged to the outside through the first housing 110, thereby increasing the heat dissipation effect. In addition, since the inductor 131 is disposed in the inductor accommodating groove 130 and fixed through molding, the inductor can be fixed inside the case without a separate coupling member for fixing the inductor 131.

One surface of the base includes: a plate 111; a first protrusion 112 being protruded more from the plate than the plate 111; a second recessed portion 130 being more recessed from the first protrusion 112 than the plate 111; and a third protrusion 114 being protruded more from the second recessed portion 130 than the plate 111. The first protrusion 112, the second recessed portion 130, and the third protrusion 114 may form the accommodating groove 130. In order to form the inductor accommodating groove 130 for accommodating the inductor 131 therein, as shown in FIG. 2, the base of the first housing 110 is formed with protruded and recessed regions. The plate 111 is a plate region with a planar shape, and is a region where elements being included in the inverter module other than the inductor are disposed. At this time, a substrate on which other elements are mounted may be disposed in the plate 111. At this time, the substrate may include a plurality of substrates that are stacked for efficient use of area.

Unlike the plate region, in the region where an inductor is to be accommodated 131, an accommodating groove 130 capable of accommodating the inductor 131 may be formed. The inductor accommodating groove 130 must be capable of performing molding on the inductor 131, so it is necessary to form a step to prevent the liquid molding solution from flowing to the outside. To this end, in order to prevent the solution from flowing into the plate 111, a first protrusion 112 may be formed, and a second protrusion may be formed on the opposite side, and a second recessed portion 130 in which the inductor 131 is disposed is formed between the first protrusion 112 and the third protrusion 114. That is, the base may include a plate 111, a first protrusion 112, a second recessed portion 130, and a third protrusion 114, in sequence.

At this time, it may include a heat sink being extended from the other surface of the base, which is an outer surface of the first housing 110. The heat being generated from the inductor being molded in the inductor accommodating groove 130 is transferred to one surface of the base along the molding material and may be discharged to the outside through the heat sink 140 formed on the other surface of the base. A heat sink is a structure that dissipates heat and can be formed by thin plates by being spaced apart from one another.

At this time, the surface of the base includes: a first recessed portion corresponding to the first protrusion 112; a second protrusion corresponding to the second recessed portion 130; and a third recessed portion corresponding to the third protrusion 114, wherein the heat sink 140 may extended from the first recessed portion, the second protrusion, and the third recessed portion. The base is formed to have a thin thickness rather than a thick thickness in order to quickly transfer the heat from the inductor to the heat sink 140 in a shape corresponding to the inductor accommodating groove 130. That is, it is configured with a first recessed portion, a second recessed portion, and a third recessed portion, corresponding to the first protrusion, the second recessed portion, and the second protrusion, respectively. Through this, since it is not formed to be unnecessarily thick, heat can be dissipated quickly. The second protrusion corresponding to the second recessed portion 130 being disposed with the inductor 131 includes: a first surface 113-1 parallel to the plate; a second surface 113-2 in contact with the first recessed portion; a third surface 113-3 in contact with the third recessed portion, wherein the heat sink 140 is formed by being extended from the first surface 113-1, the second surface 113-2, and the third surface 113-3. The outer surface of the inductor accommodating groove where the inductor 131 is disposed is surrounded by three surfaces, and the heat sink 140 is extended directly from the three sides. That is, since the heat sink is extended not only in a lower direction but also in a direction toward the side surfaces, a large heat dissipation region can be formed, thereby improving the heat dissipation effect.

The plurality of side plates include a first side plate 116 and a second side plate 117 facing each other, and the accommodating groove 130 may be disposed closer to the second side plate 117 than to the first side plate 116. The plurality of side plates include a first side plate 116 and a second side plate 117 facing each other, wherein a wire connecting part 200 may be connected to the first side plate 116, wherein the second side plate 117 may be a side plate that is in contact with the external air surface without being connected to other components, and wherein the inductor accommodating groove 130 may be disposed closer to the second side plate 117 than to the first side plate 116. The third protrusion 114 constituting the inductor accommodating groove 130 may be directly connected to the second side plate 117. That is, it may be connected to the first side plate 116, the plate 111, the first protrusion 112, the second recessed portion 130, the third protrusion 114, and the second side plate 117. A third side plate and a fourth side plate may be formed by being extended between both side surfaces of the first side plate 116 and the second side plate 117, respectively.

In a direction perpendicular to the direction in which the first side plate 116 and the second side plate 117 facing each other, one or more partition walls 119 separating the accommodating groove 130 into a plurality of accommodating grooves 118 may be included. At this time, the inductor 131 may be disposed in at least one accommodating groove among the plurality of accommodating grooves 118. A plurality of accommodating grooves 130 for accommodating components that generate a lot of heat may be formed through the partition walls 119. The inductor 131 may include a plurality of inductors, or other elements that generate heat in addition to the inductors may be accommodated in each accommodating groove 118 and molded.

The inductor 131 may be disposed directly in the accommodating groove 130 in the form of a coil, or may be disposed in the accommodating groove 130 in the form of a module. In order to increase the heat dissipation effect due to molding, an inductor 131 in a coil shape can be disposed directly in the accommodating groove 130 and molded. As shown in FIG. 4, the inductor 131 in a coil shape is disposed in the accommodating groove 118 and molded to increase the heat dissipation effect and at the same time, it can be fixed without a coupling member such as a screw.

Or, the inductor 131 may be delivered in a module form, or may be disposed in the accommodating groove 130 in a module shape to simplify the process. When disposed in the accommodating groove 130 in a module shape, molding may or may not be performed. In this case as well, heat can be discharged from all three surfaces, thereby increasing the heat dissipation effect.

The heat sink 140 is extended not only in the downward direction 141 but also extended in a direction toward the side surface 142 to increase the heat dissipation region. At this time, the inductor 131 is disposed at a position close to direction toward the side surface 142. The direction toward the side surface 142 may be upward when the inverter module 1 is installed in the field, and since heat is transferred from a low place to a high place, a higher heat dissipation effect can be expected.

In addition, a curved shape, like a heat sink, can be formed not only on an outer surface of the first housing but also on an inner side surface of the inductor where the inductor is disposed. By connecting the heat dissipation surface formed through this to the outside and connecting the fins, it is possible to form a structure that dissipates heat on the inner side surface as well.

The inverter module 1 according to an embodiment of the present invention includes an inductor to convert power. At this time, the inductor is disposed inside the module through the case. The case includes: a first housing 110 including a base and a plurality of side plates being extended from the base; and a second housing 120 being coupled to the first housing 110, wherein an accommodating groove 130 for accommodating the inductor 131 is formed on one surface of the base forming the internal space of the first housing 110. Here, the case accommodating the inductor may be the inverter module case described previously.

The inverter module case according to an embodiment of the present invention may include: a first case 100 being disposed with the inverter driving unit; and a second case 200 being disposed with a wire being connected to the inside of the first case 100. The first case 100 may be the case in FIGS. 2 to 4 described previously. The first case 100 and the second case 200 are configured as separate cases, but as shown in FIG. 6, they can be connected to each other through surface bonding. Hereinafter, the description will focus on the coupling relationship between the first case 100 and the second case 200. The first surface of the first case 100 being coupled to the second case 200 may include a sealing protrusion 151, a first coupling groove 152, and a second coupling groove 153. Here, the first surface 116 may be an outer surface of the first side plate 116 of the first housing 110.

The sealing protrusion 151 is protruded in a direction in which it is coupled with the second case 200 and performs sealing when coupled with the second case 200. Since a wire must pass through and be connected between the first case 100 and the second case 200, a hole must be formed for the wire to pass through. At this time, sealing must be performed to prevent external substances such as water or dust from entering through the hole. In particular, for the inverter module 1 being installed externally, sealing, which isolates the inside from the outside, is important. The sealing protrusion 151 performs sealing to isolate the hole through which the wire passes from the outside.

At this time, the coupling groove for coupling the first case 100 and the second case 200 includes: a first coupling groove 152 being disposed inside the sealing space; and a second coupling groove 153 being disposed outside. When the coupling groove is disposed only inside the sealing space, there is a problem that the coupling process becomes complicated, and the space in which sealing must be performed is expanded, which may degrade the sealing effect.

By forming a coupling groove outside the sealing space, not only the sealing effect is improved, but also the process becomes easier. The first coupling groove 152 is formed inside the sealing space being formed by the sealing protrusion 151, and the second coupling groove 153 is formed outside the sealing space being formed by the sealing protrusion 151. The first coupling groove 152 and the second coupling groove 153 may be configured with one or more pieces. Since the first case 100 and the second case 200 must be firmly fixed, a plurality of coupling grooves may be formed for multiple couplings.

The first surface of the first case 100 is formed with pluralities of wire holes through which the wire passes, and the first coupling groove 152 may be disposed between the pluralities of wire holes. The location where the hole is formed may be structurally weak, so the first coupling groove 152 can be disposed between the wire holes to maintain the coupling firmly. In addition, the second coupling groove 153 may be formed along the edge of the first surface of the first case 100. By forming a second coupling groove 153 along the edge, the concentrated load can be distributed by preventing it from being concentrated only in the center region when coupled, and by forming it along the edge of the first surface of the first case 100, the coupling can be accomplished being isolated from the internal space when coupled, and through this, the sealing effect can be enhanced.

Figure 8:
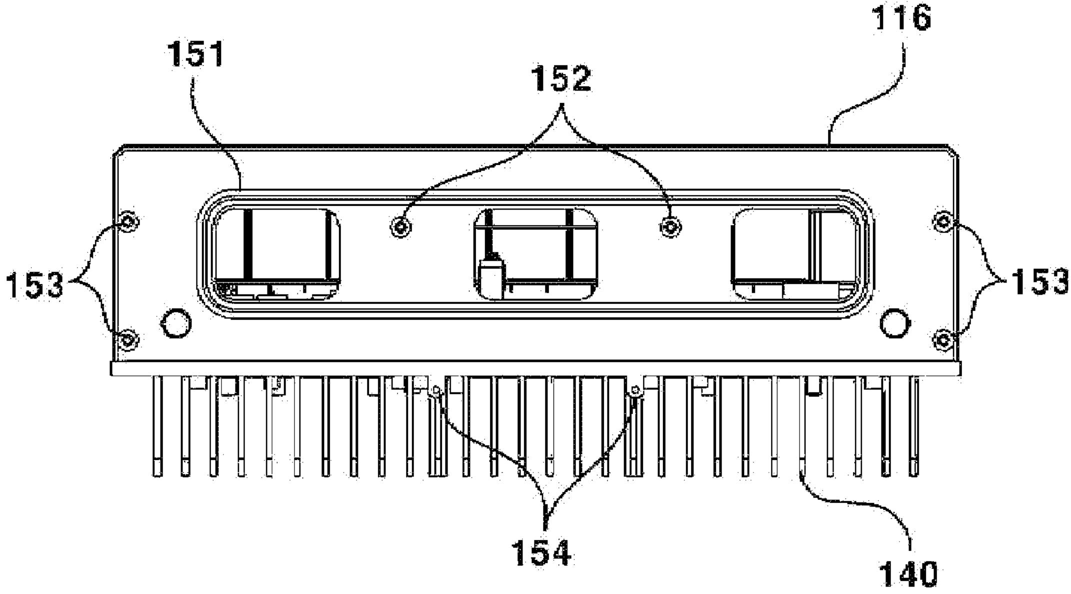

The first coupling groove 152 and the second coupling groove 153 may be formed on a first surface of the first case 100 or may be formed through a shape being protruded. To this end, a first coupling protrusion being protruded in a direction being coupled to the second case 200 inside the sealing space being formed by the sealing protrusion 151 and includes the first coupling groove 152, and a second coupling protrusion being protruded in a direction being coupled to the second case 200 outside the sealing space being formed by the sealing protrusion 151 and includes the second coupling groove 153 may be included. At this time, the first coupling protrusion may be inserted into the first coupling hole 213, and the second coupling protrusion may be inserted into the second coupling hole 214. The first coupling protrusion and the second coupling protrusion are formed in a protruded shape as shown in FIG. 8, and by inserting the protruded shape into the first coupling hole 213 and the second coupling hole 214, respectively, and through this, the connection between the first case 100 and the second case 200 can be guided. As shown in FIG. 8, the coupling groove is not connected to the internal space and is formed as an internally closed structure with a predetermined depth, thereby preventing foreign substances from entering the internal space through the coupling groove.

Figure 9:
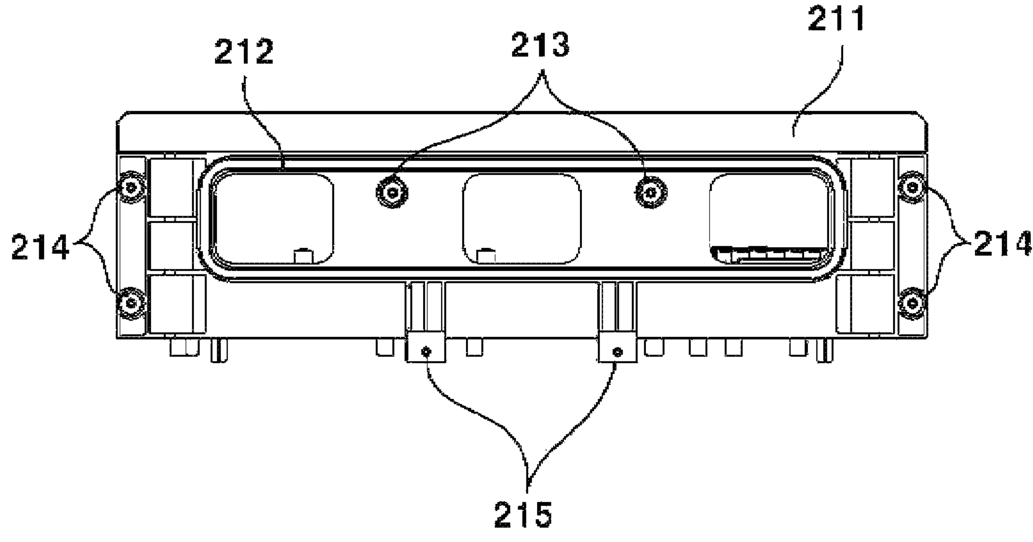
Figure 10:
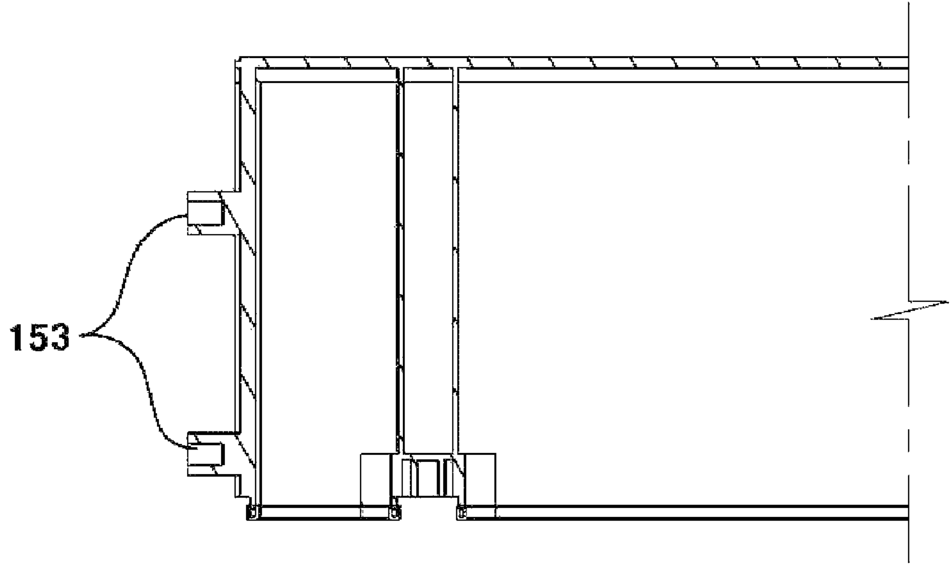

The first case 100 includes: a base disposed in a direction perpendicular to the first surface of the case; and one or more third coupling protrusions being protruded from the base in a direction perpendicular to the first surface of the case, wherein the third coupling protrusion may include a third coupling groove 154 in a direction being coupled to the second case 200. The first case 100 may include a first housing and a second housing forming an internal space, and as shown in FIG. 9, when the base on which the heat sink 140 is formed is formed in a housing separate from the housing on which the first coupling groove 152 and the second coupling groove 153 are formed, a third coupling groove 154 for coupling the base and the wire connecting part 200 can be formed through the third coupling protrusion. The heat sink 140 may be made of heavy metal such as aluminum, and may weigh more than other injection molded housings or the second case 200. In other words, it needs to be firmly coupled to the housing in which the heat sink 140, which accounts for a large proportion of the weight, is formed. At this time, the second case and the base of the housing where the heat sink 140 is formed can be directly connected and firmly coupled through the third coupling groove 154. That is, each of the housings can be firmly fixed by including a coupling groove being connected to the wire connecting part. The weight of the heat sink 140 can be distributed by directly coupling the base of the housing where the heat sink 140 is formed and the second case.

The second surface 211 of the second case 200 being coupled to the first case 100 corresponds to the first surface of the first case 100, includes: a sealing groove 212 in which the sealing protrusion 212 is accommodated; one or more first coupling holes 213 being formed inside the sealing space formed by the sealing groove 212; and one or more second coupling holes 214 being formed outside the sealing space where the sealing groove 212 is formed. The sealing protrusion 151 and the sealing groove 212 correspond to each other, and the sealing protrusion 151 is accommodated in the sealing groove 212 to form a sealing space. The sealing groove 212 can be sealed using a sealing member such as an O-ring or an adhesive. The first coupling hole 213 and the second coupling hole 214 are formed at positions corresponding to the first coupling groove 152 and the second coupling groove 153, respectively, and can be screw-coupled together using a screw or the like.

The region of the second surface 211 of the second case 200 is smaller than the internal cross-sectional region of the second case 200, and some regions of the edge of the second case 200 may not be overlapped with the internal cross-sectional region of the second case 200. At this time, the second coupling hole 214 is disposed in an edge region of the second case not being overlapped with the internal cross-sectional region of the second case, and thus does not form a hole into the internal space. Therefore, when coupled, isolation from the internal space can be maintained. As shown in FIG. 11, the second coupling hole 214 is disposed in a boundary region of the second case not being overlapped with the internal cross-sectional region of the second case, and the coupling can be performed outside the second case 200 rather than inside the second case 200 through the coupling member 216, such as a screw, thereby making the process easier.

As previously described, when the third coupling groove 154 is formed in the base where the heat sink 140 is formed, the second case 200 is also formed to have a structure corresponding thereto. The second surface 211 of the second case 200 includes one or more fourth coupling protrusions corresponding to the third coupling protrusions, and the fourth coupling protrusion includes a third coupling hole 215 in a direction being coupled to the first case 100. As shown in FIG. 12, each of the third coupling groove 154 and the third coupling hole 215 is formed in the coupling protrusion for being coupled so that they can be coupled regardless of sealing, and by being directly coupled through a coupling member 217 such as a screw, a firm coupling with the heat sink 140 can be achieved.

The first case 100 includes a base and a cover case covering the base, wherein the cover case includes a cover plate and a plurality of side plates being extended from the cover plate and coupled to the base, wherein one surface of one of the plurality of side plates is a first surface of the first case, wherein the second case may be connected to the cover case through the first coupling hole and the second coupling hole, and may be connected to the base through the third coupling hole. Here, it may include a heat sink being extended from the base. As previously described, the first case is different from the case described in FIGS. 2 to 5, and the housing in which the heat sink 140 is formed includes only a base, and the housing being coupled thereto may include a cover plate and a plurality of side plates. At this time, the second surface of the second case is connected to the cover case through the first coupling hole and the second coupling hole, and is directly connected to the base through the third coupling hole to be firmly coupled.

The first coupling hole may be screw-coupled into the first coupling groove inside the second case, and the second coupling hole may be screw-coupled into the second coupling groove outside the second case. This allows coupling to be performed through fastening points evenly distributed on the inside and outside. The fastening points of the inverter driving unit and the wire connecting part (wiring box) can be evenly distributed to the upper end portion, left and right ends, and lower end portion, and through this, exposure of the fastening screws on the front of the product can be minimized. In addition, the load of the wire connecting part 200 can be prevented from being excessively concentrated on the inverter driving unit 100 by connecting the fastening points at the lower end portion with the heat sink or the housing where the heat sink is formed.

In addition, since it can be coupled without a separate reinforcement frame, material costs can be reduced and the manufacturing process can be simplified, and workability is also improved by minimizing the screws being fastened inside the wire connecting part.

The inverter module 1 according to an embodiment of the present invention includes: an inverter driving unit that converts power; a first case in which the inverter driving unit is disposed; a wire connecting part including a wire connecting the inverter driving unit and the outside; and a second case in which the wire connecting part is disposed inside, wherein the first surface of the first case being coupled with the second case includes: a sealing protrusion being protruded in a direction coupled to the second case; at least one first coupling groove being formed inside the sealing space being formed by the sealing protrusion; and at least one second coupling groove being formed outside the sealing space being formed by the sealing protrusion, and wherein the second surface of the second case being coupled with the first case includes: a sealing groove in which the sealing protrusion is accommodated; at least one first coupling hole formed inside the sealing space formed by the sealing groove; and one or more second coupling holes being formed outside the sealing space where the sealing groove is formed, and wherein the wire connects the inverter driving unit and the outside inside the sealing space. Here, the first case and the second case may be the inverter module case described with reference to FIGS. 6 to 12.

The inverter module case according to an embodiment of the present invention may include a sealing structure between two housings forming the case. Here, it is natural that the sealing structure where the first housing 110 and the second housing 120 are coupled may be formed on opposite sides. Hereinafter, it will be described by way of example that the sealing protrusion 311 is formed in the first housing and the sealing groove is formed in the second housing.

An inverter module case according to an embodiment of the present invention includes: a first housing; and a second housing being coupled to a side plate of the first housing, wherein the first housing includes: a sealing protrusion 311 being protruded along the edge in a direction of coupling with the second housing; and one or more coupling grooves 320 being formed outside the sealing space formed by the sealing protrusion 311, wherein the second housing includes: a sealing groove 331 in which the sealing protrusion 311 is accommodated; and one or more coupling holes 340 being formed outside the sealing space being formed by the sealing groove 331, wherein the sealing groove 331 includes: a first curved portion 332 being curved inward at the position where the coupling hole 340 is formed, and wherein the sealing protrusion 311 may include a second curved portion 312 corresponding to the first curved portion 332.

The sealing protrusion 311 of the first housing 110 and the sealing groove 331 of the second housing 120 are configurations being formed in a coupling direction of the first housing 110 and the second housing 120 of the first case, and although the configurations are different from the sealing protrusion 311 of the first case 100 and the sealing groove 212 of the second case 200 described previously, both configurations perform sealing, that is, the sealing protrusion 311 of the first case 100 and the sealing groove 331 of the second case 200 perform sealing in the connection between the two cases, and the sealing protrusion 311 of the first housing 110 and the sealing groove 331 of the second housing 120 perform sealing in the connection between the two housings constituting one case.

When the first housing 110 and the second housing 120 are coupled inside the sealing space, foreign substances may enter inside through the coupling hole. To solve this problem, a first curved portion 312 and a second curved portion 332 are formed. By bypassing the coupling hole 340 along the shape of the coupling hole 340, the coupling hole 340 is formed outside the sealing space. The sealing effect can be increased as the coupling hole 340 is spaced apart from the internal space. At this time, the first curved portion 312 may have a rib shape that follows the shape of the coupling hole 340 and is spaced apart from the coupling hole 340 at a predetermined distance. In order to form the coupling groove 320 corresponding to the coupling hole 340, the first housing 110 is protruded from the side plate in a direction toward the inner space and includes a coupling protrusion including the coupling groove 320. The coupling groove 320 is an internally closed structure that is not connected to the internal space, and instead of forming a structure independent of the internal space, a coupling protrusion may be formed, but may be located outside the sealing member using the second curved portion 332.

At this time, the first housing 110 may include one or more support parts 330 being extended from the coupling protrusion to the base. The coupling protrusion is formed only to the depth of the coupling groove 320, and since there is no structure to support the force on the first housing 110 in the coupling direction, the connection with the second housing 120 can be strengthened by forming the support part 330 up to the base. Through the above structure, the coupling hole 340 and the coupling groove 320 can be screw-coupled together outside the sealing space. The coupling hole 340 is formed outside, as shown in FIG. 15, and is spaced apart from the internal space to enable coupling without affecting the sealing.

In the first housing 110, a first substrate 410 being disposed in the first housing 110, a second substrate 420 being spaced apart from the first substrate 410, and a bus bar 430 electrically connecting the first substrate 410 and the second substrate 420, wherein the bus bar 430 may include: a first substrate coupling portion 431 being coupled to the first substrate 410; a second substrate coupling portion 433 being coupled to the second substrate 420; and a connection support portion 432 being extended from the first substrate coupling portion 431 and the second substrate coupling portion 433 in a direction being spaced apart from the first substrate 410 and the second substrate 420 to support the second substrate 420. In order to reduce the module size, the substrate being disposed inside the first housing 110 may include a first substrate 410 and a second substrate 420 and may be disposed in a stacked form while being vertically spaced apart.

Here, the bus bar may be formed on the edges 430 and 460 of the second substrate 420, or may be formed 450 in the hole 451 being formed in the center region of the second substrate 420. The second substrate 420 can be more firmly supported by forming a support portion not only on the edge but also in the center region.

The inverter module case according to an embodiment of the present invention may include: a first case 100 including the first housing and the second housing and having an inverter driving unit disposed therein; a second case 200 in which a wire being connected to the inside of the first case is disposed; and an external cover 480 covering the first case 100 and the second case 200.

The external cover 480 is slidingly coupled from one of the first case 100 and the second case 200 in the direction toward the other case; the external cover 480 includes an upper plate and a plurality of side plates being extended from the upper plate; the external cover 480 is extended inward from the side plate of the external cover and being spaced apart from the upper plate to form a first space; a guide portion 471 that guides the first protrusion 472 being formed in the first case or the second case to be introduced into the first space and a prevention unit that restricts movement of the first protrusion 472 introduced into the first space is included; and the prevention unit may connect the inner upper plate of the external cover and the guide unit.

In addition, the external cover includes an elastic hook 481 being extended inward from the side plate of the external cover, and the elastic hook 481 can hook-coupled to a second protrusion 482 being formed at the end of the second case when slidingly coupled.

By sliding coupling with the first protrusion 472 through the guide portion 471 and hook coupling using the elastic hook 481 and the second protrusion 482, the external cover can be coupled without a coupling member such as a screw. Through this, design improvements are possible, and ease of operation and fastening force can be secured when working on the external cover.

The inverter module according to an embodiment of the present invention includes: an inverter driving unit that converts power; a first case in which the inverter driving unit is disposed; a wire connecting part including a wire connecting the inverter driving unit and the outside; and a second case in which the wire connecting part is disposed inside, wherein the first case includes a first housing and a second housing coupled to a side plate of the first housing, wherein the first housing includes: a sealing protrusion being protruded along the edge in a direction of coupling with the second housing; and one or more coupling grooves being formed outside the sealing space formed by the sealing protrusion, wherein the second housing includes: a sealing groove in which the sealing protrusion is accommodated; and one or more coupling holes being formed outside the sealing space formed by the sealing groove, wherein the sealing groove includes a first curved portion being curved inward at a position where the coupling hole is formed, and wherein the sealing protrusion includes a second curved part corresponding to the first curved part. Here, the first case may be the inverter module case described with reference to FIGS. 13 to 19.

The wire connecting part 210 of the inverter module case according to an embodiment of the present invention includes a wiring bracket that connects a wire being inserted from the outside to the inverter driving unit. The wiring bracket 510 according to an embodiment of the present invention includes an upper plate and a plurality of side plates 518 and 519 supporting the upper plate, wherein the upper plate includes: a first plate 511; a second plate 512 being spaced apart from the first plate 511 in both directions of the first plate; a third plate (not shown); a first hole 514 being formed between the first plate 511 and the second plate 512; a second hole (not shown) formed between the first plate 511 and the third plate; and an inclined portion 516 being inclined downward from the second plate 512, and wherein the inclined portion 516 includes a plurality of wire holes 517.

The wire hole 517 is formed to be spaced apart from the first hole 514, thereby preventing contact between wires. The number of wire holes 517 may vary depending on the number of channels being connected to the outside. For example, if implemented to enable public use for lineup capacities ranging from 4 kW to 11.4 kW, in order to connect a total of 6 wires, 2 for each channel (PV1CH TO PV3CH), more than 6 wire holes 517 may also be formed.

The wiring bracket is a bracket for connecting the wire being entered from the outside to the inverter driving unit 100 without twisting or tangling, a fuse holder 520 including one or more fuses is disposed at an upper portion of the first plate 511, and a switch module 530 including one or more switches is disposed below the first plate 511.

When the fuse holder 520 is disposed at an upper portion of the first plate 511, the second plate and the third plate are disposed in two directions where wires are inputted into and outputted from the fuse holder 520. At this time, the first hole 514 being formed between the first plate 511 and the second plate 512, and the second hole (not shown) being formed between the first plate 511 and the third plate are formed. Here, each hole is connected to a predetermined region at both ends in a direction perpendicular to the direction in which the two plates are connected, and other internal spaces are not connected to form a hole. Or, a hole can be formed by cutting the connection part of the two plates. The hole may have a rectangular shape corresponding to the plate shape, or may have other shapes. Or, it may include a plurality of holes.

Figure 23:
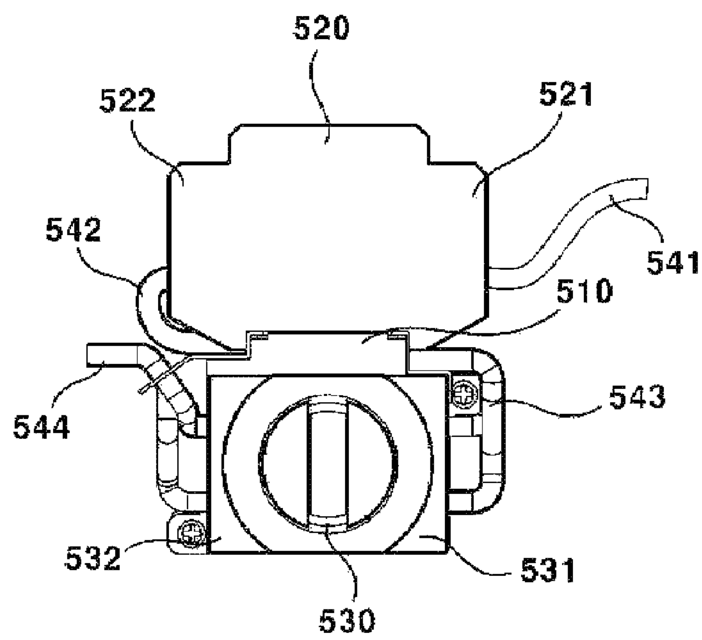

As shown in FIG. 23, the switch module 530 is disposed at a lower portion where the fuse holder 520 is disposed at an upper portion thereof, so that space can be used efficiently and twisting or tangling of wires can be prevented. For this purpose, the first wire 541 being inputted from the solar power panel is applied to the fuse holder 520 in a first direction; a second wire 542 passing through the inside of the fuse holder 520 and being outputted from the fuse holder 520 in a first direction passes through the first hole 514 and the second hole and is extended in a second direction is applied to the switch module 530 in a first direction; and the third wire 544 that passes through the inside of the switch module 530 and being outputted from the switch module 530 in a first direction passes through the wire hole 517 and is applied to the inverter driving unit. As shown in FIGS. 23 and 24, the wiring bracket can efficiently connect wires by reversing the direction of extension of the wire being outputted from the stacked fuse holder 520 and applying it to the switch module 530.

Through this, the first wire 541 being inputted from the solar power panel is applied to a first surface 521 of the fuse holder; a second wire 542 being outputted from a second surface 522 of the fuse holder, which is opposite to the first surface 521 of the fuse holder, through the inside of the fuse holder 520 is applied to a first surface 531 of the switch module after sequentially passing through the first hole 517 and the second hole; the third wire 544 passing through the inside of the switch module 530 and being outputted to the second side 532 of the switch module, which is opposite to the first side 531 of the switch module, passes through the wire hole and is applied to the inverter driving unit; the first surface 521 of the fuse holder and the first surface 531 of the switch module are located in the same direction; the first hole 514 is located on the second surface 522 of the fuse holder; and the second hole is located on the first surface 521 of the fuse holder.

The side plate 518 being extended from the first plate 511 is coupled to the case where the wiring bracket is disposed, and the side plate 519 being extended from the second plate 512 and the side plate (not shown) being extended from the third plate can be coupled with the switch module 530 and firmly fixed to the case and the switch module 530.

Here, the switch module includes a manual lever 533 that controls the switch module, and the manual lever may be exposed to the side surface of the case. The user can manually operate the switch using the manual lever.

Through the wiring bracket, the order of wires applied to the fuse holder may match the order of wires passing through the wire hole, thereby preventing twisting and tangling of the wires. In addition, the wiring bracket structure prevents interference for each channel, and fuses, wires, and switches can be assembled to connect to the product after assembling externally. Through this, assembly can be improved and common use is possible for each lineup capacity from 4 kW (PV1CH) to 11.4 kW (PV3CH).

The inverter module according to an embodiment of the present invention includes: an Inverter driving unit that converts power; a first case in which the inverter driving unit is disposed; a wire connecting part including a wire connecting the inverter driving unit and the outside; and a second case in which the wire connecting part is disposed, wherein the wire connecting part includes, a wiring bracket for arranging a wire connecting the inverter driving unit and the outside, wherein the wiring bracket includes an upper plate and a plurality of side plates supporting the upper plate, wherein the upper plate includes: a first plate; a second plate being spaced apart from the first plate in both directions of the first plate; and a third plate; a first hole being formed between the first plate and the second plate; a second hole being formed between the first plate and the third plate; an inclined portion inclined downward from the second plate, wherein the inclined portion may include a plurality of wire holes. Here, the wiring bracket may be the wiring bracket described with reference to FIGS. 20 to 24.

The inverter module according to an embodiment of the present invention may include: an element holder that applies pressure to the heat dissipation part so that the element being used to convert power can be kept in contact with the heat dissipation part, such as a heat sink. The element holder and the elements mounted on the element holder can be included as an element module. The element module can be assembled externally and mounted on the inverter module.

An element module according to an embodiment of the present invention includes one or more first elements and an element holder accommodating the first element, wherein the first element includes a body and one or more connecting pins being extended from the body, wherein the element holder includes a base and an element portion being formed in the base to accommodate one or more first elements, wherein the body of the first element is disposed in the element accommodating unit, wherein a first region being opened toward a first surface of the base and a connecting pin of the first element are disposed, wherein a second region being opened in a direction opposite to the first surface of the base and toward a second surface of the base is included, and wherein the first region and the second region are overlapped at least in part.

At this time, the element may be a switching element, the element holder may be a switching element holder, and the element module may be a switching element module. Here, the switching element or switching element holder is used to explain the application of the switching element module, and may be an element holder that accommodates various elements that generate heat other than the switching element and the corresponding elements. The element may be an element including a body and an extension pin being extended from the body and connected to the substrate. Hereinafter, the description will focus on the switching element and the switching element holder that accommodates the switching element.

As shown in FIG. 25, the switching element module 600 includes a switching element holder 620 that accommodates a switching element and one or more switching elements 610 being disposed in the switching element holder 620. Here, the switching element may be a semiconductor element such as an FET or a diode.

Here, the switching element 610 includes a body 611 and one or more connecting pins 612 being extended from the body, wherein the switching element holder 620 includes a base 621 and a switching element accommodating part being formed in the base 621 to accommodate one or more switching elements. The heat-generating body 611 of the switching element must be in contact with the heat dissipation part, and the connecting pin 612 must be connected to the substrate. For this purpose, the switching element accommodating part includes: a first region 631 where the body 611 of the switching element is disposed and is opened toward the first surface of the base 621, and a second region 632 where the connecting pin of the switching element is disposed and is opened toward the second surface of the base, which is opposite to the first surface of the base. At least a part 634 of the first region and the second region overlaps. The connecting pin 612 must be exposed in the direction toward the substrate to be connected to the substrate, and the body 611 must be exposed in the direction opposite to the substrate so as to be in contact with the heat dissipation part located opposite to the substrate. Each includes a first region 631 where the body 611 is exposed and a second region 632 where the connecting pin 612 is exposed. At this time, in order to increase the ease of the process, the first region 631 and the second region 632 are partially overlapped with each other and are opened on both directions. When attaching the switching element to the switching element accommodating part, it is necessary to insert the connecting pin into the second region first, and at this time, since the overlapping region between the first region 631 and the second region 632 is opened in both directions, the process of inserting the connecting pin becomes easier. At this time, the region where the first region 631 and the second region 632 are overlapped can be set depending on the thickness of the connecting pin, and for example, it can be set between 1 to 5 times of the thickness of the connecting pin.

The switching element holder 620 is extended from a first surface of the base 621 and includes a coupling protrusion 640 including a coupling hole. A coupling hole for coupling to the substrate is formed in the coupling protrusion 640 of the switching element holder. A heat sink, which is a heat dissipation part, is disposed at a lower portion of the switching element holder 620, and may include a heat dissipation pad to increase the heat transfer rate to the heat sink. The heat dissipation pad can prevent electrical connection between the switching element and the heat sink when they come into direct contact. Through the coupling hole, the substrate at an upper portion and the heat dissipation pad at a lower portion are integrally screw-coupled together. In addition, other parts can be integrated and coupled by pressing. A screw is inserted into the coupling hole of the switching element holder 620, so that the substrate, the switching element holder 620, the heat dissipation pad, and the heat sink can be connected together to press the switching element 610 in the direction toward the heat sink.

Here, the coupling protrusion 640 is disposed on the side surface of the coupling protrusion 640 and includes a guide portion 643 being extended toward any one direction of the two directions perpendicular to the direction in which the two first hooks 641 and 642 are disposed from the side surfaces of the two first hooks 641 and 642 being formed in opposite directions and the coupling protrusion 640.

The coupling protrusion 640 is inserted into the first hole formed in the substrate and coupled to the substrate, and the two first hooks 641 and 642 are inserted into the first hole of the substrate and hook-coupled to one surface of the substrate, and the guide portion 643 is inserted into a rib being formed in the first hole of the substrate corresponding to the guide portion 643 and guides the coupling with the substrate. In order to guide the direction, the guide portion 643 may be formed in only one of two directions perpendicular to the direction in which the two first hooks 641 and 642 are disposed. Or, it may be formed in both directions. In addition, only one of the two hooks may be formed, or one or more hooks may be further included between the two first hooks 641 and 642. In the case of three hooks, a guide portion may be formed in a remaining direction, and in the case of four hooks, the guide portion may not be formed.

The first region 631 includes: a first lower surface being recessed more than the first surface of the base, and a coupling protrusion 636 being extended from the first lower surface of the first region toward the first surface of the base, wherein the body 611 of the switching element includes a coupling hole 617 corresponding to the coupling protrusion 636, wherein the cross-sectional area of the coupling protrusion 636 may have a length shorter in a first direction than the length in a second direction perpendicular to the first direction, and wherein the first direction of the coupling protrusion 636 may be a direction being overlapped with the second region 632.

Figure 28:
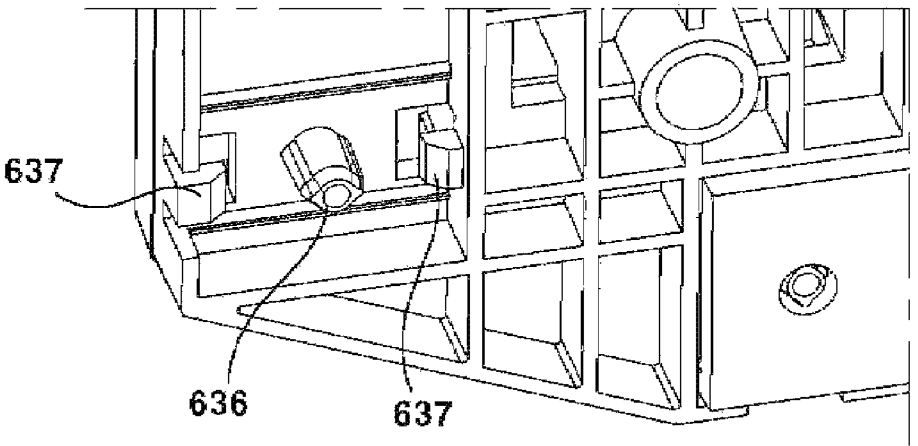
Figure 29:
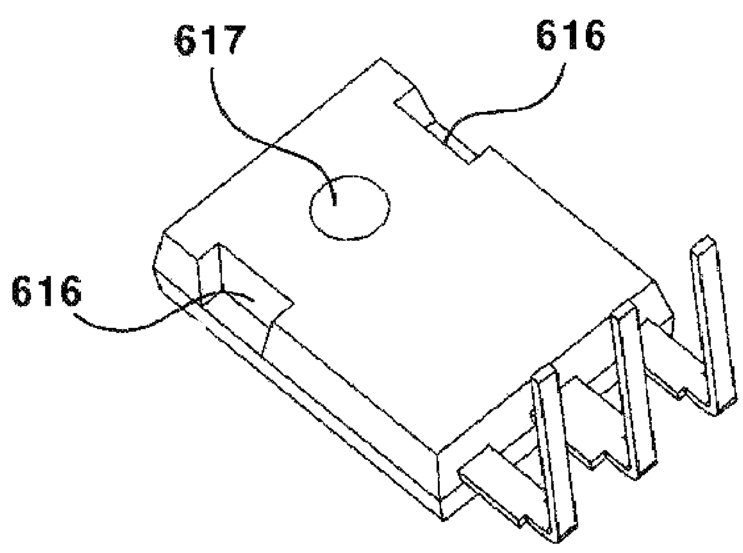

In addition, it includes a plurality of side surfaces being extended from the first lower surface of the first region 631 toward the first surface of the base, wherein among the plurality of side surfaces of the first region, the first side surface and the second side surface facing each other include hooks 637 being extended in directions facing each other, and wherein the body 611 of the switching element may include a coupling groove 616 corresponding to the hook. As shown in FIG. 28, the coupling protrusion 636 and the hook 637 being formed in the first region 631 are respectively connected to the coupling hole 617 and coupling groove 616 being formed in the switching element 610 as shown in FIG. 29.

Figure 30:
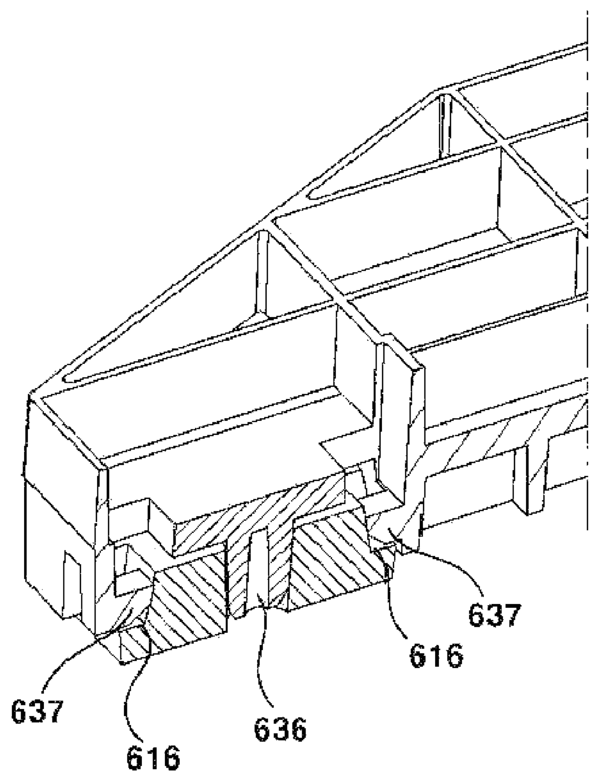

After assembling the parts, a hook 637 and a circular protrusion shape are formed so that they can be fixed during transportation. At this time, the hook 637 may be formed to be overlapped with the coupling groove 617 being formed on a side surface of the switching element 610 by more than 0.1 mm, and the shape of the coupling protrusion 636 being formed in the center may also be overlapped with the coupling hole 617 of the switching element 610 to an equivalent level. As shown in FIG. 30, the coupling protrusion 636 and the hook 637 are respectively connected to the coupling hole 617 and coupling groove 616 being formed in the switching element 610.

The shape of the coupling protrusion is not circular, but may be close to an oval that is long in one direction. At this time, only the long part is overlapped with the coupling hole 617 of the switching element. This is a shape to avoid interference in the assembly direction when the switching element is coupled to the switching element holder, the connecting pin is first inserted into the second region 632, and then the body is tilted and inserted into the first region.

The second region 632 includes: a second lower surface that is more recessed than the second surface of the base, and a plurality of side surfaces being extended from the second lower surface toward the second surface of the base, wherein the connecting pin 612 of the switching element includes: a first extension part being extended from the body in a first direction; and a second extension part being extended from the first extension part in a second direction perpendicular to the first direction, and wherein the second extension part is exposed toward the second surface of the second base in the second region.

The first extension part includes: a first-first extension part 614 being extended from the body and having a first width; and a first-second extension part 615 being extended from the first-first extension part 614 and connected to the second extension part, wherein more than half of the area of the first-first extension part 614 may be overlapped with the second region 635.

Figure 31:
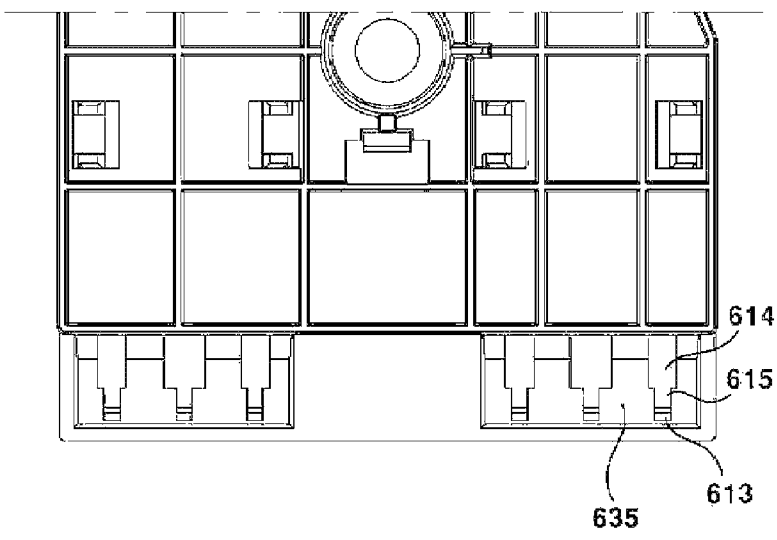

As shown in FIG. 31, the second lower surface 635 forming the second region is formed to support more than half of the first-first extension part 614, which is a wide part of the connecting pin so that it can play a role in preventing the switching element from being vertically separated when moving after assembling the switching element holder in the substrate. Among the being extended portions of the connecting pin, the portion that requires support is widened, and the portion is supported by the second lower surface 635, thereby preventing the switching element from being vertically separated.

The outermost surface of the body 611 in a direction of the first surface of the base may be formed to be more protruded than the switching element holder. Since the switching element holder 620 is a structure for allowing the body 611 of the switching element 610 to be in contact with the heat dissipation part, the outermost surface of the body 611 of the switching element 610 may be formed to be protruded more than the switching element holder so that the body 611 of the switching element 610 is located closest to the heat dissipation part. To this end, the recession depth of the first lower surface of the first region may be formed to be smaller than the thickness of the switching element body 611.

Figure 32:
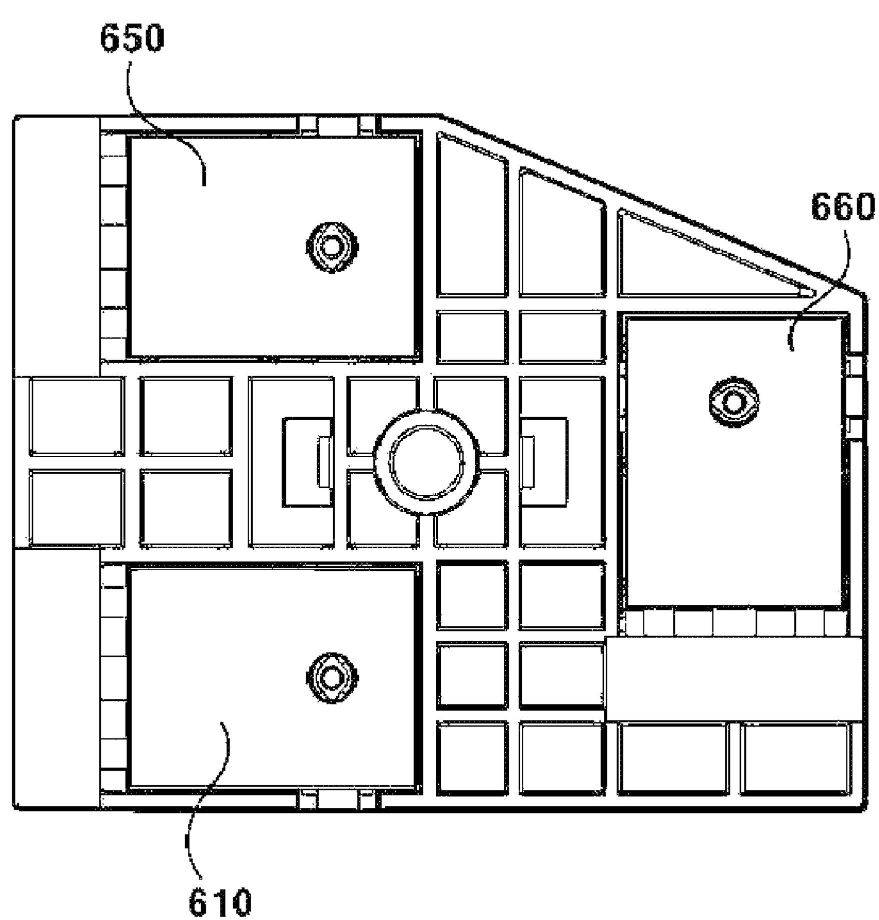

As shown in FIG. 32, when a plurality of switching elements 610, 650, and 660 are disposed in a switching element holder and when assembled with a substrate, height tolerances may occur between parts. To compensate for height tolerance, heat dissipation performance can be stably secured by applying a heat dissipation pad (thermal pad). The thickness of the heat dissipation pad can be adjusted when pressed to compensate for height tolerance. At this time, the size of the heat dissipation pad must be sufficiently wide to secure the insulation distance between the switching element and the heat sink. For example, it can be made to be longer than 15 mm at the four side surfaces of each switching element.

Through the switching element holder structure described above, heat dissipation performance can be secured by coupling three switching elements 610, 6550, and 660 with the substrate and heat sink at once, as shown in FIG. 32. Here, the switching elements may be of the same type or at least one switching element may be of a different type. For example, some elements may be FETs and other elements may be diodes.

The inverter module according to an embodiment of the present invention may include an element module that applies pressure to the element being disposed inside the heat dissipation part to maintain contact with the heat dissipation part, such as a heat sink. At this time, the element may be a heating component that generates heat, or it may be a switching element.

The inverter module according to an embodiment of the present invention includes: a substrate; one or more first elements being electrically connected to the substrate; an element holder accommodating the first element; a heat dissipation pad whose surface is in contact with the first element being accommodated in the element holder; and a heat sink being disposed on the other surface of the heat dissipation pad, wherein the first element includes a body and one or more connecting pins being extended from the body, wherein the element holder includes a base and an element accommodating part being formed in the base to accommodate one or more first elements, wherein the element accommodating part includes: a first region where the body of the first element is disposed and opened in a direction toward the first surface of the base; and a second region where the connecting pin of the first element is disposed and opened in a direction toward the second surface of the base opposite to the first surface of the base, wherein the first region and the second region are overlapped with each other at least in part, and wherein the substrate, the element holder, the heat dissipation pad, and the heat sink are integrally screw-coupled together. Here, the switching element holder may be an element holder of the element module described with reference to FIGS. 25 to 32.

As described above, the present invention has been described with specific details such as specific components and limited embodiments and drawings, but this is only provided to facilitate a more general understanding of the present invention, and the present invention is not limited to the above embodiments, and those skilled in the art can make various modifications and variations from this description.

Therefore, the spirit of the present invention should not be limited to the described embodiments, and not only the scope of the patent claims described below, but also all things that are equivalent or equivalent to the scope of these claims fall within the scope of the present invention.

The invention claimed is:

1. An element module comprising:

a first element; and an element holder accommodating the first element, wherein the first element comprises a body and one or more connecting pins extended from the body, wherein the element holder comprises a base and an element accommodating part formed in the base to accommodate the first element, wherein the element accommodating part comprises:

a first region in which the body of the first element is disposed, and opened toward to a direction of a first surface of the base; and a second region in which a connecting pin of the first element is disposed, and opened toward to a direction of a second surface of the base which is opposite to the direction of the first surface of the base, and wherein the first region and the second region are overlapped at least in part.

2. The element module according to claim 1, wherein the element holder comprises a coupling protrusion extended from the first surface of the base and comprising a coupling hole.

3. The element module according to claim 2, wherein the coupling protrusion comprises:

two first hooks disposed on a side surface of the coupling protrusion and formed in opposite directions to each other; and a guide portion extended from the side surface of the coupling protrusion in one direction of two directions perpendicular to the direction in which the two first hooks are disposed.

4. The element module according to claim 3, wherein the coupling protrusion is inserted into the first hole formed in a substrate and coupled to the substrate, wherein the two first hooks are inserted into the first hole of the substrate and hook-coupled to one surface of the substrate, and wherein the guide portion is inserted into a rib formed in the first hole of the substrate corresponding to the guide portion to guide coupling with the substrate.

5. The element module according to claim 4, wherein through the coupling hole, the substrate at an upper portion and the heat dissipation pad and heat sink at a lower portion are integrally screw-coupled together.

6. The element module according to claim 2, comprising a plurality of side surfaces extended from a first lower surface of the first region toward to the direction of the first surface of the base, wherein a first side surface and a second side surface facing each other among the plurality of side surfaces of the first region comprises hooks extended in directions facing each other, and wherein the body of the first element comprises a coupling groove corresponding to the hook.

7. The element module according to claim 1, wherein the first region comprises:

a first lower surface more recessed than the first surface of the base; and a coupling protrusion extended from the first lower surface of the first region toward the first surface of the base, wherein the body of the first element comprises a coupling hole corresponding to the coupling protrusion, and wherein a cross-sectional region of the coupling protrusion has a length in a first direction shorter than a length in a second direction perpendicular to the first direction.

8. The element module according to claim 7, wherein the first direction is a direction overlapped with the second region.

9. The element module according to claim 1, wherein the second region comprises:

a second lower surface more recessed than the second surface of the base; and a plurality of side surfaces extended from the second lower surface toward to the direction of the second surface of the base, wherein the connecting pin of the first element comprises:

a first extension part extended from the body in a first direction; and a second extension part extended from the first extension part in a second direction perpendicular to the first direction, and wherein the second extension part is exposed toward to a direction of the second surface of the base of the second region.

10. The element module according to claim 9, wherein the first extension part comprises:

a first-first extension part extended from the body and having a first width; and a first-second extension part extended from the first-first extension part and connected to the second extension part, and wherein more than half of a region of the first-first extension part is overlapped with the second region.

11. The element module according to claim 1, wherein an outermost surface of the body in the direction of the first surface of the base is protruded more than the element holder.

12. The element module according to claim 1, wherein the first element is a switching element.

13. An element holder comprising:

a base;

a coupling protrusion extended from a first surface of the base and comprising a coupling hole; and an element accommodating part in which a first element is accommodated, wherein the element accommodating part comprises:

a first region opened toward to a direction of the first surface of the base; and a second region opened toward to a direction of the second surface of the base which is opposite to the direction of the first surface of the base, and wherein the first region and the second region are overlapped at least in part.

14. An inverter module comprising:

a substrate;

a first element electrically connected to the substrate;

an element holder accommodating the first element;

a heat dissipation pad whose one surface is in contact with the first element accommodated in the element holder; and a heat sink disposed on the other surface of the heat dissipation pad, wherein the element holder comprises a base and an element accommodating part formed in the base to accommodate the first element, wherein the element accommodating part comprises:

a first region in which the body of the first element is disposed, and opened toward to a direction of a first surface of the base; and a second region in which a connecting pin of the first element is disposed, and opened toward to a direction of a second surface of the base which is opposite to the direction of the first surface of the base, wherein the first region and the second region are overlapped at least in part, and wherein the substrate, the element holder, the heat dissipation pad, and the heat sink are integrally screw-coupled together.

15. The inverter module according to claim 14, wherein the element holder comprises a coupling protrusion extended from the first surface of the base and comprising a coupling hole.

16. The inverter module according to claim 15, wherein the coupling protrusion comprises:

two first hooks disposed on a side surface of the coupling protrusion and formed in opposite directions to each other; and a guide portion extended from the side surface of the coupling protrusion in one direction of two directions perpendicular to the direction in which the two first hooks are disposed.

17. The inverter module according to claim 16, wherein the coupling protrusion is inserted into the first hole formed in a substrate and coupled to the substrate, wherein the two first hooks are inserted into the first hole of the substrate and hook-coupled to one surface of the substrate, and wherein the guide portion is inserted into a rib formed in the first hole of the substrate corresponding to the guide portion to guide coupling with the substrate.

18. The inverter module according to claim 15, comprising a plurality of side surfaces extended from a first lower surface of the first region toward to the direction of the first surface of the base, wherein a first side surface and a second side surface facing each other among the plurality of side surfaces of the first region comprises hooks extended in directions facing each other, and wherein the body of the first element comprises a coupling groove corresponding to the hook.

19. The inverter module according to claim 14, wherein the first region comprises:

a first lower surface more recessed than the first surface of the base; and a coupling protrusion extended from the first lower surface of the first region toward the first surface of the base, wherein the body of the first element comprises a coupling hole corresponding to the coupling protrusion, wherein a cross-sectional region of the coupling protrusion has a length in a first direction shorter than a length in a second direction perpendicular to the first direction, and wherein the first direction is a direction overlapped with the second region.

20. The inverter module according to claim 14, wherein the second region comprises:

a second lower surface more recessed than the second surface of the base; and a plurality of side surfaces extended from the second lower surface toward to the direction of the second surface of the base, wherein the connecting pin of the first element comprises:

a first extension part extended from the body in a first direction; and a second extension part extended from the first extension part in a second direction perpendicular to the first direction, and wherein the second extension part is exposed toward to a direction of the second surface of the base of the second region.

* * * * *